United States Patent
Onodera

(10) Patent No.: US 7,752,517 B2
(45) Date of Patent: Jul. 6, 2010

(54) TEST DEVICE AND METHOD FOR CIRCUIT DEVICE AND MANUFACTURING METHOD FOR THE SAME

(75) Inventor: Takeshi Onodera, Kanagawa (JP)

(73) Assignee: Sony Corporation, Tokyo (JP)

(*) Notice: Subject to any disclaimer, the term of this patent is extended or adjusted under 35 U.S.C. 154(b) by 507 days.

(21) Appl. No.: 11/528,530

(22) Filed: Sep. 28, 2006

(65) Prior Publication Data

US 2007/0088996 A1 Apr. 19, 2007

(30) Foreign Application Priority Data

Oct. 5, 2005 (JP) .................... P2005-292421

(51) Int. Cl.
- G05B 11/01 (2006.01)
- G01R 27/28 (2006.01)
- G01R 31/28 (2006.01)
- G01R 31/26 (2006.01)

(52) U.S. Cl. .................... 714/733; 700/21; 700/39; 702/118; 438/15

(58) Field of Classification Search ............. 714/733; 702/118; 438/15; 700/21, 39
See application file for complete search history.

(56) References Cited

U.S. PATENT DOCUMENTS

| | | | |
|---|---|---|---|
| 4,921,810 A * | 5/1990 | Kunieda et al. ............. 438/15 |
| 5,301,199 A * | 4/1994 | Ikenaga et al. ............. 714/733 |
| 5,390,131 A * | 2/1995 | Rohrbaugh et al. ............. 716/4 |
| 5,398,250 A * | 3/1995 | Nozuyama .................... 714/726 |
| 5,907,511 A * | 5/1999 | Crafts ........................ 365/191 |
| 6,011,733 A * | 1/2000 | Fischer et al. ................ 365/200 |
| 6,363,504 B1* | 3/2002 | Rhodes et al. ............. 714/724 |
| 6,363,510 B1* | 3/2002 | Rhodes et al. ............. 714/738 |
| 7,096,386 B2* | 8/2006 | Ozawa ........................ 714/30 |
| 2002/0070746 A1* | 6/2002 | Sugiura et al. .............. 324/765 |

FOREIGN PATENT DOCUMENTS

JP 06-295958 10/1994

* cited by examiner

*Primary Examiner*—Ramesh B Patel
*Assistant Examiner*—Thomas H Stevens
(74) *Attorney, Agent, or Firm*—Rader, Fishman & Grauer PLLC

(57) ABSTRACT

A test device that makes a test of a circuit device including a plurality of modules being substitutable in terms of function for one another, and in which a function change can be made for assignment to each of the modules based on an incoming control signal. The test device includes: a control section that generates the control signal, without changing a function to be assigned to a whole of the modules, to make the function change for assignment to each of the modules at least in a group of the modules; and a determination section that detects whether the circuit device operates differently when the function change is made for assignment to the modules, and based on a detection result, determines whether or not at least the group of the modules includes a defective module.

3 Claims, 21 Drawing Sheets

CASE WITH $f^{M1}=f^{M2}$

M1 AND M2 ARE NORMAL

BOOLEAN ALGEBRA EXPRESSION  $\overline{M1}\cdot\overline{M2}=1$

0: NORMAL
1: DEFECTIVE

CASE WITH $f^{M1}\neq f^{M2}$

BOOLEAN ALGEBRA EXPRESSION  $M1+M2=1$

M2 IS DEFECTIVE

M1 IS DEFECTIVE

| | $f^{M1} = f^{M2}$ | $f^{M2} = f^{M3}$ | DEFICIENCY-CORRECTION TARGET |
|---|---|---|---|
| ① | Y | Y | NONE |
| ② | Y | N | M3 |
| ③ | N | Y | M1 |
| ④ | N | N | M2 |

CORRECT M3

CORRECT M7

TEST DEVICE AND METHOD FOR CIRCUIT DEVICE AND MANUFACTURING METHOD FOR THE SAME

CROSS REFERENCES TO RELATED APPLICATIONS

The present invention contains subject matter related to Japanese Patent Application JP 2005-292421 filed in the Japanese Patent Office on Oct. 5, 2005, the entire contents of which being incorporated herein by reference.

BACKGROUND OF THE INVENTION

1. Field of the Invention

The invention relates to a test device and method for making a deficiency test for a circuit device and a circuit device manufacturing method using the test method and, more specifically, to a test device for use for a circuit device including a plurality of modules being substitutable in terms of function for one another.

2. Description of the Related Art

The recent semiconductor integrated circuits have marked tendencies of dimension reduction and circuit size increase, and yield reduction due to manufacturing defect is becoming increasingly serious. In order to take remedial steps against such yield reduction, the deficiency correction using a redundant circuit has become popular because there is a limitation therefore only by optimizing the manufacturing conditions. With such deficiency correction, a semiconductor chip is provided therein with a redundant circuit in advance, and the redundant circuit takes the place of any deficient portion so that the semiconductor chip is prevented from being defective in its entirety. Exemplarily with a large-capacity DRAM (Dynamic Random Access Memory) or SRAM (Static Random Access Memory), it is common to replace any defective memory cell with a redundant memory cell.

With the deficiency correction using a redundant circuit as such, there needs to specifically know what portion in the circuit device is defective. For this purpose, with the device of Patent Document 1 (Specification of Japanese Patent No. 3192220), a plurality of modules including a redundant module is each provided with a pad for test use. While the modules are each being electrically disconnected from other portions of the device, the pads for test use are made to come in contact with a probe so that a test signal is input. The response of the signal input is then checked to see whether or not the modules operate in a normal manner.

SUMMARY OF THE INVENTION

The issue with the recent dimension-reduced semiconductor integrated circuits is the size of pads for test use, i.e., the pads are considerably larger than other circuit elements and the width of wiring. If such large-sized pads are plurally provided on a semiconductor chip, the semiconductor chip is unnecessarily increased in size, and this is considered a drawback.

With the device of Patent Document 1 individually testing the modules, there needs to include an additional circuit for electrically disconnecting any of the testing modules from other portions, thereby resulting in a drawback of size increase for the semiconductor chip. Such size increase of the semiconductor chip becomes increasingly serious if a larger number of modules are reduced in size to a further degree.

It is thus desirable to provide a test device and method that can perform a deficiency test whether there is any defective module in those others provided in a circuit device with no more need to provide the circuit device with pads for test use and an additional circuit for specific use. It is also desirable to provide a circuit device manufacturing method of, by using the test method, being able to correct any deficiency while suppressing the increase of the circuit size.

According to a first embodiment of the invention, there is provided a test device that makes a test of a circuit device including a plurality of modules being substitutable in terms of function for one another, and in which a function change can be made for assignment to each of the modules based on an incoming control signal. The test device of the first embodiment includes: a control section that generates the control signal, without changing a function to be assigned to the whole of the modules, to make the function change for assignment to each of the modules at least in a group of the modules; and a determination section that detects whether the circuit device operates differently when the function change is made for assignment to the modules, and based on the detection result, determines whether or not at least the group of the modules includes a defective module.

With the test device of the first embodiment, the control section generates the control signal for the circuit device to make the function change for assignment to each of the modules at least in a group of the modules. The determination section detects whether the circuit device operates differently when the function change is made for assignment to the modules, and based on the detection result, determines whether or not at least the group of the modules includes a defective module.

Alternatively, the control section may generate the control signal, without changing the function to be assigned to the whole of the modules, to make the function change for assignment to each of the modules in a part of the group of the modules determined by the determination section as including the defective module. With this being the case, the determination section may detect whether the circuit device operates differently when the function change is made for assignment to the modules, and based on the detection result, determine whether or not the defective module is included in the part of the group of the modules or in a remaining part of the group of the modules.

When the group of the modules determined as including the defective module carries three of the modules, the determination section may detect whether the circuit device operates differently when the control section makes the function change between two of the modules in the group of the modules, and whether the circuit device operates differently when the control section makes the function change between the remaining one of the modules in the group of the modules and either of the two modules, and based on the detection result, identify the defective module.

According to a second embodiment of the invention, there is provided a test method of making a test of a circuit device including a plurality of modules being substitutable in terms of function for one another, and in which a function change can be made for assignment to each of the modules based on an incoming control signal. The test method includes: a first step of generating the control signal, without changing a function to be assigned to the whole of the modules, to make the function change for assignment to each of the modules at least in a group of the modules; and a second step of detecting whether the circuit device operates differently when the function change is made for assignment to the modules in the first step, and based on a detection result, determining whether or not at least the group of the modules includes a defective module.

According to a third embodiment of the invention, there is provided a circuit device manufacturing method that includes a circuit formation step, a test step and a writing step.

The circuit formation step forms, on a semiconductor substrate, a circuit that includes: N (where N is an integer larger than 2) modules being substitutable in terms of function for one another; a circuit block including (N−1) input/output sections that each output at least a signal to one of the modules, and/or each receive at least a signal generated in one of the modules; a module selection section that selects the (N−1) modules from the N modules in accordance with an incoming control signal, and establishes a one-to-one connection between the selected (N−1) modules and the (N−1) input/output sections in the circuit block; a signal input section that receives a signal designating which of the modules is to be disconnected from the (N−1) input/output sections; a storage section that is capable of storing therein information about which of the modules is to be disconnected from the (N−1) input/output sections; and a control section that generates, in a first operation mode, the control signal to disconnect the module designated by the signal provided to the signal input section from the (N−1) input/output sections, and in a second operation mode, generates the control signal to disconnect the module designated by the information written in the storage section from the (N−1) input/output sections.

In the test step, the N modules are subjected to a deficiency test in the first operation mode.

In the writing step, based on the test result in the test step, a determination is made which of the modules is to be disconnected from the (N−1) input/output sections, and information is written in the storage section to designate the module.

The test step includes: a first step of generating the control signal to change a connection state among each of the modules at least in a group of the N modules and the input/output sections; and a second step of detecting whether the circuit operates differently when the connection state is changed in the first step, and based on a detection result, determining whether or not at least the group of the modules includes a defective module.

According to the embodiments of the invention, there is no more need to provide the circuit device with pads for test use and an additional circuit for specific use because modules can be tested for deficiency by detecting whether the circuit device operates differently after any function change is made for assignment to any of the modules.

What is more, the semiconductor integrated circuit can be reduced in size compared with a case of requiring pads for test use and an additional circuit for specific use. This is because the module deficiency can be corrected based on the result of detecting whether the semiconductor integrated circuit operates differently after any function change is made for assignment to any of the modules.

DESCRIPTION OF PREFERRED EMBODIMENTS

Figure 1:
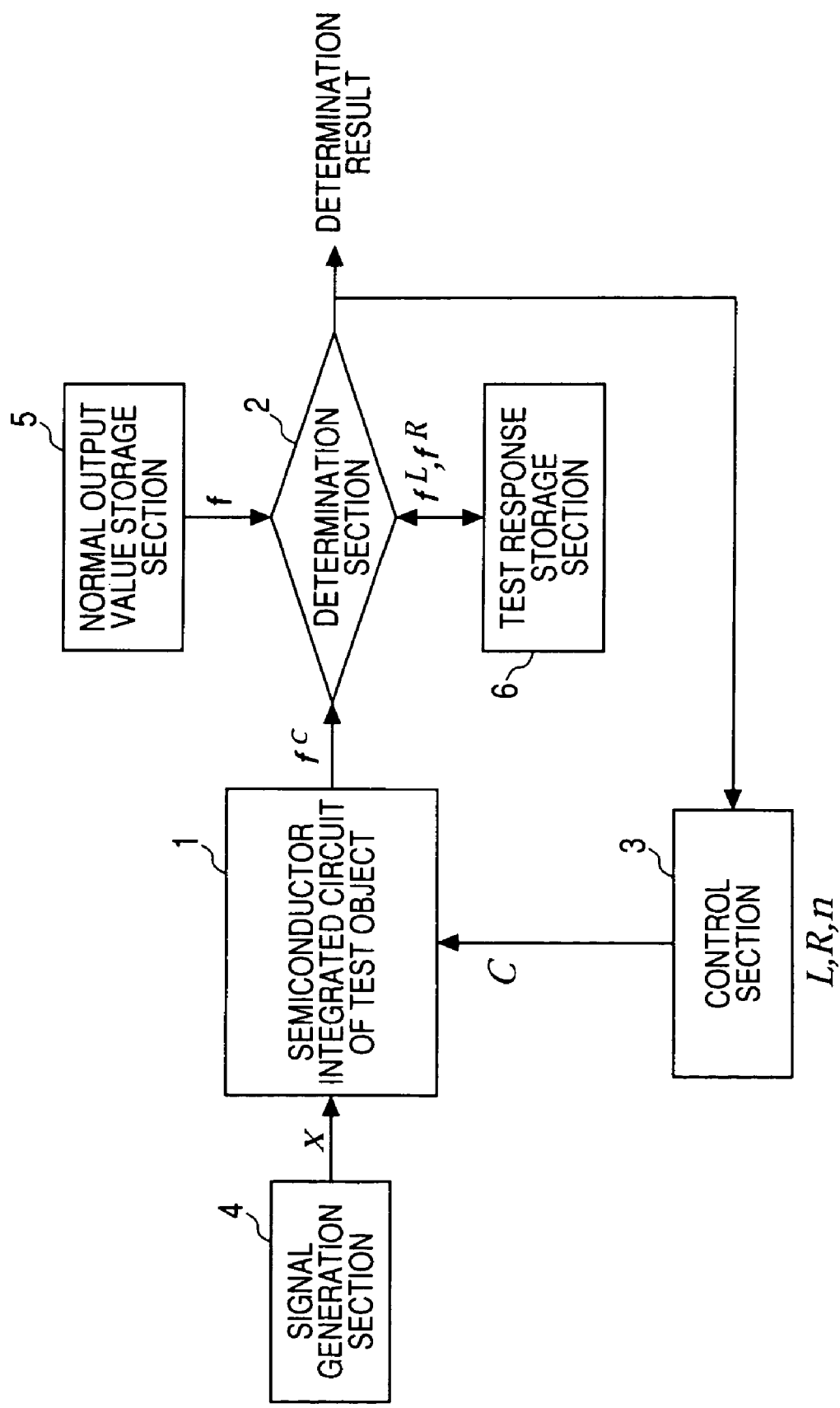
FIG. 1 is a diagram showing an exemplary test device for use for a semiconductor integrated circuit in an embodiment of the invention.

FIG. 1 is a diagram showing an exemplary test device for making a test of a semiconductor integrated circuit, which is an example of a circuit device of an embodiment of the invention.

The test device of FIG. 1 is configured to include a determination section 2, a control section 3, a signal generation section 4, a normal output value storage section 5, and a test response storage section 6.

The determination section 2 is an embodiment of the determination section of the invention.

The control section 3 is an embodiment of the control section of the invention.

The signal generation section 4 is an embodiment of the signal generation section of the invention.

Prior to describing the test device of FIG. 1, a semiconductor integrated circuit 1 being a test object is described.

The semiconductor integrated circuit 1 includes a plurality of modules being substitutable in terms of function for one another, and in which a function change can be made for assignment to each of the modules based on a control signal coming from the control section 3. To make such a function change for assignment to any of the modules, the connection is changed among the internal node of the semiconductor integrated circuit 1 and the modules, for example.

Figure 2:
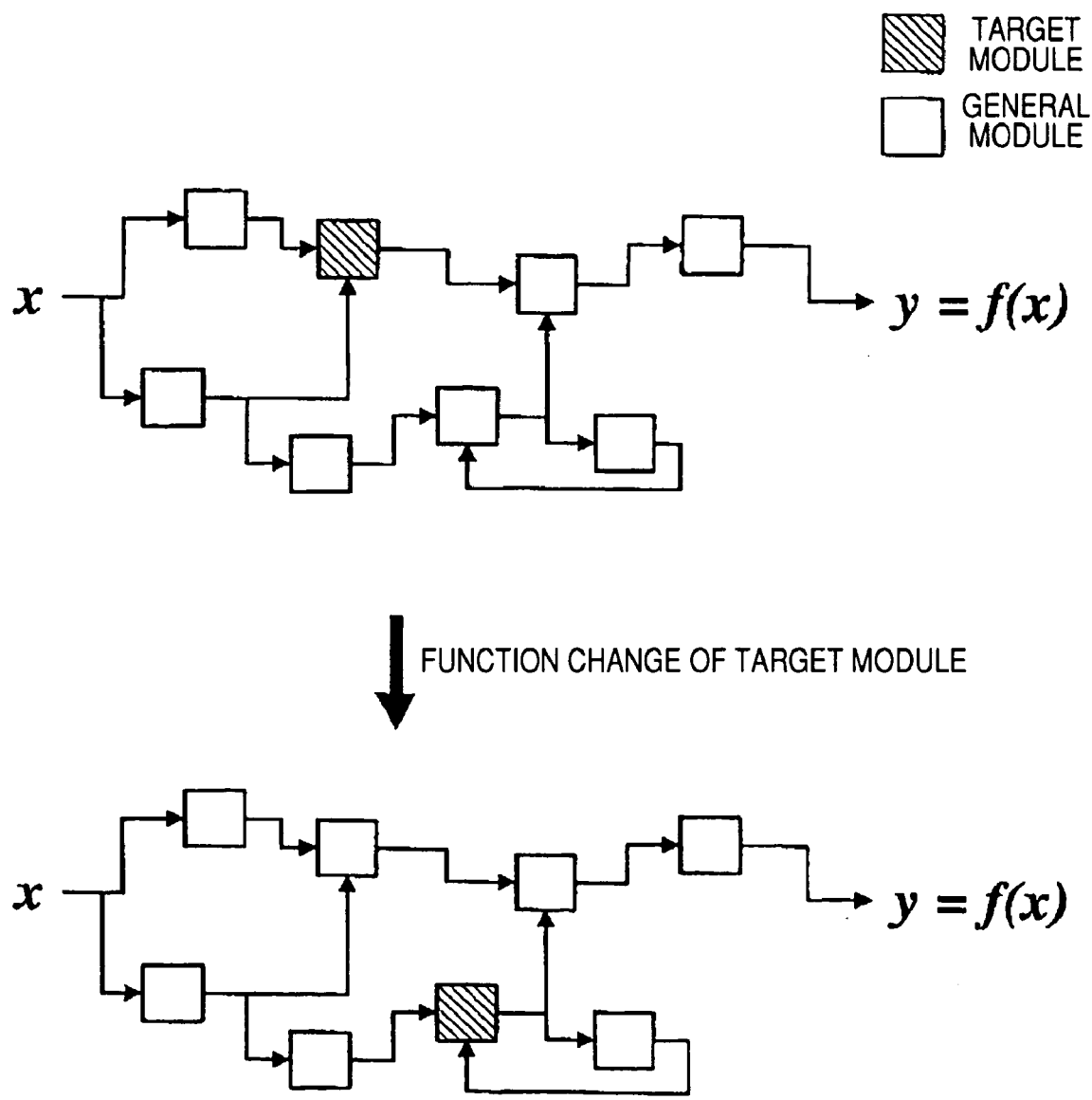
FIG. 2 is a first diagram for illustrating a response change observed in the semiconductor integrated circuit after a function change is made for assignment to any of the modules.

FIG. 2 is a diagram showing exemplary function change for assignment to any of the modules.

A semiconductor integrated circuit exemplarily shown in FIG. 2 includes eight modules being substitutable in terms of function for one another. The modules are each in charge of a predetermined function. In FIG. 2 example, anyone arbitrary module in these eight modules is determined as a target module, and its connection relationship with others is changed. In this case, the target module is assigned a different function depending on the changed connection relationship.

Even if some function change is made for assignment to the modules, if the function assigned to the whole of the modules remains the same, the entire function of the semiconductor integrated circuit shows no change. In the semiconductor integrated circuit of FIG. 2, exemplified here is a case where a normal response signal sequence of the semiconductor integrated circuit with respect to an input signal sequence x is "f(x)". In such a case, when the function assigned to all of the eight modules remains the same, the response signal sequence with respect to the input signal sequence x shows no change from "f(x)" in the semiconductor integrated circuit even if any function change is made for assignment to the modules.

However, this is not applicable if the target module is defective, i.e., even if the function assigned to all of the modules is kept the same, the entire function of the semiconductor integrated circuit shows some change if a function to be assigned to the target module is changed.

Figure 3:
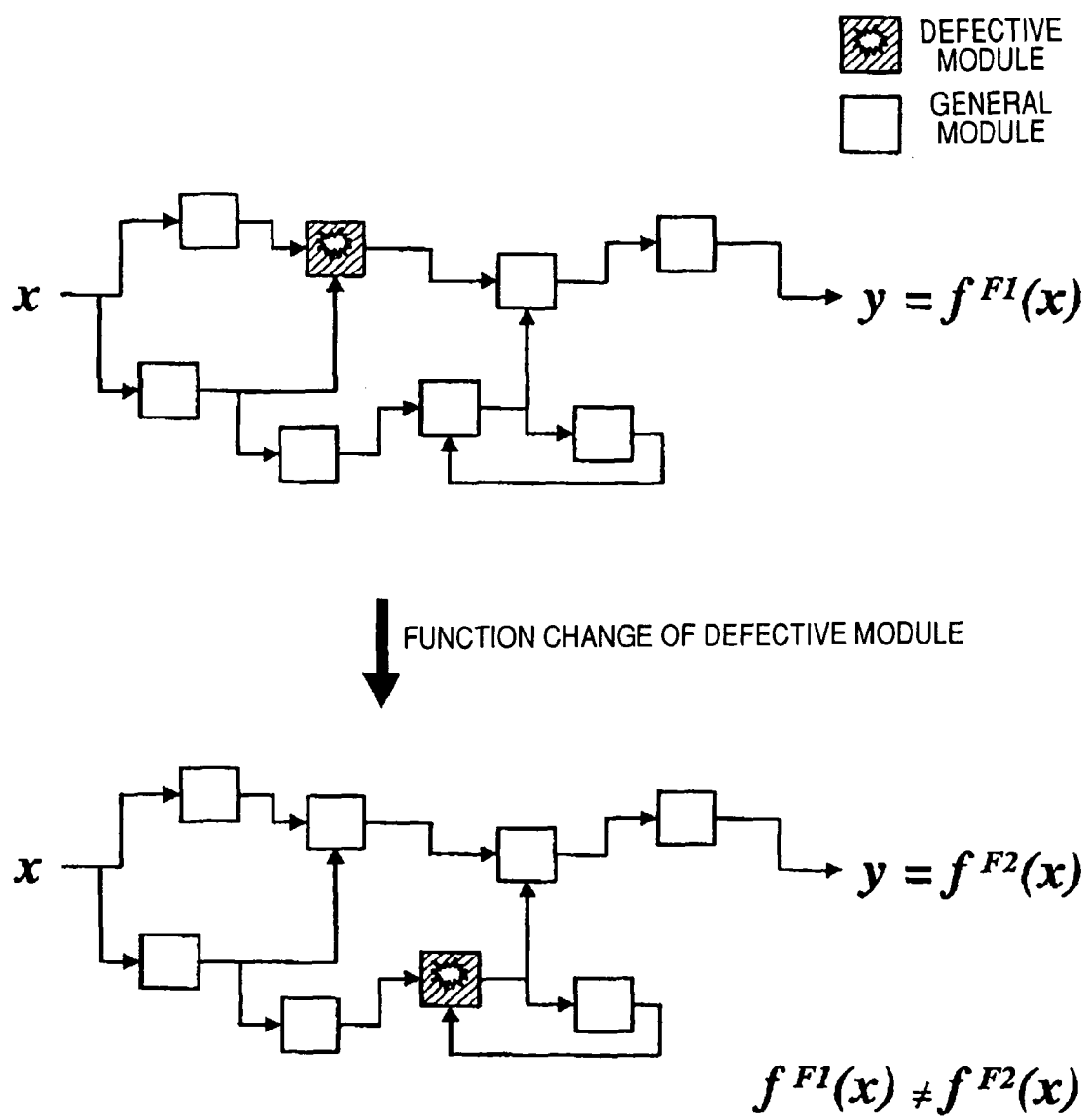
FIG. 3 is a second diagram for illustrating a response change observed in the semiconductor integrated circuit after a function change is made for assignment to any of the modules.

FIG. 3 is a diagram illustrating an exemplary response change observed in the semiconductor integrated circuit after a function change is made for assignment to any of the modules.

Assuming here are that a response signal sequence is "$f^{F1}(x)$" when the target module is assigned a function F1, and a response signal sequence is "$f^{F2}(x)$" when the target module is assigned a function F2. When the target module is operating normally, and when no other module is defective, this is equivalent to the case of FIG. 2, and the response signal sequences $f^{F1}(x)$ and $f^{F2}(x)$ are the same. On the other hand, when the target module is defective, the influence to be exerted on the entire function by the defective function F1 is different from the influence to be exerted by the defective function F2. Therefore, when any appropriate input signal sequence x is provided, the response signal sequences $f^{F1}(x)$ and $f^{F2}(x)$ are not the same.

Utilizing the fact that the entire function of the semiconductor integrated circuit shows some change when a function change is made to the defective module, the test device of FIG. 1 makes a deficiency test for the modules.

The semiconductor integrated circuit 1 includes, preferably, modules more than necessary for the purpose of implementing the entire function. With this being the case, a part of the modules being redundant is put in an unassigned state. This means that if the modules are each assigned a function in such a manner that any module determined as being defective in the test device of FIG. 1 is put in an unassigned state, the deficiency of the module can be corrected.

Figure 4:
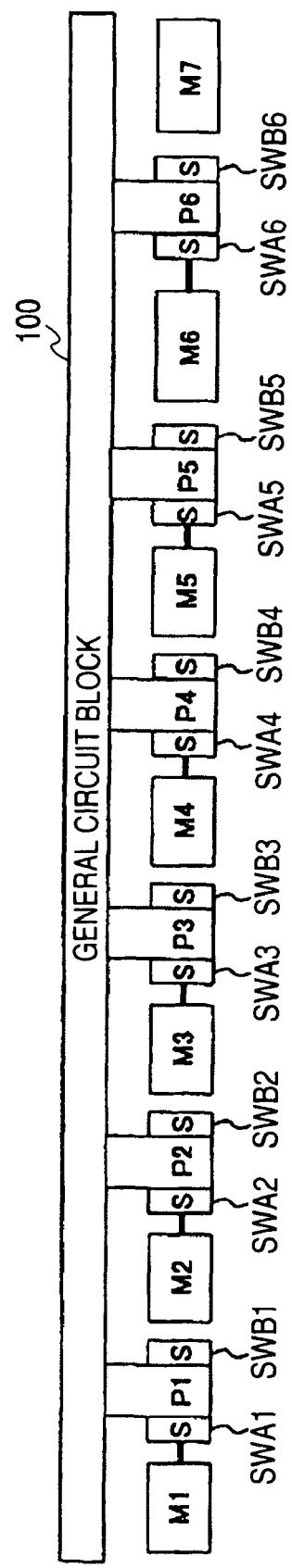
FIG. 4 is a diagram showing an exemplary configuration of the semiconductor integrated circuit.

FIG. 4 is a diagram showing an exemplary schematic configuration of the semiconductor integrated circuit 1.

The semiconductor integrated circuit 1 being a test object includes, as exemplarily shown in FIG. 4, modules M1 to M7, a general circuit block 100, switch circuits SWA1 to SWA6, and switch circuits SWB1 to SWB6.

The modules M1 to M7 are all an embodiment of the module of the invention.

The general circuit block 100 is an embodiment of the circuit block of the invention.

The circuit including the switch circuits SWA1 to SWA6 and SWB1 to SWB6 are all an embodiment of the module selection section of the invention.

The modules M1 to M7 are each a circuit taking in charge of a predetermined function, and are substitutable in terms of function for one another. The modules M1 to M7 may share the same circuit configuration, or if being substitutable in terms of function for one another, a part of the modules may be different in circuit configuration.

As to the modules M1 to M7, the circuit configuration and function are both arbitrary, e.g., some may be assigned an operation processing function such as DSP (Digital Signal Processor), or some may be assigned a relatively-simple logical operation such as lookup table. Alternatively, a plurality of circuits all assigned any equivalent function in the semiconductor integrated circuit may be collectively dealt as a module.

The modules M1 to M7 are not necessarily digital circuit, and may be analog circuit.

The general circuit block 100 includes input/output sections P1 to P6 for signal exchange with the modules M1 to M7, and each go through a predetermined process with the modules. As to the general circuit block 100, the circuit configuration and function are both arbitrary, and only a wiring will do.

The input/output sections P1 to P6 each output at least a signal to one of the modules M1 to M7, and/or receive at least a signal generated in one of the modules.

The input/output sections P1 to P6 may all receive and output the same combination of signals, or may be varying in type, and receive and output the different combination of signals.

In an exemplary case where the modules M1 to M7 include three output terminals, some of the input/output sections may receive signals from all of these three output terminals, and some of the input/output sections may receive signals from only one of those three output terminals.

A switch circuit SWAi (where i denotes an integer of 1 to 6) is connected between an input/output section Pi and a module Mi. and is turned on or off in response to an incoming control signal (not shown).

A switch circuit SWBi is connected between the input/output section Pi and a module M(i+1), and is turned on and off in response to an incoming control signal.

The switch circuits SWA1 to SWA6 and SWB1 to SWB6 configure a module selection section.

The module selection section (switch circuits SWA1 to SWA6 and SWB1 to SWB6) is a circuit serving to select six modules from seven modules (M1 to M7) in accordance with a control signal, and establish a one-to-one connection between the selected six modules and six input/output sections (P1 to P6).

Such a module selection section (switch circuits SWA1 to SWA6 and SWB1 to SWB6) connects, to each of the six input/output sections (P1 to P6), one of the two modules selected in accordance with a control signal. That is, the module selection section selects either the module Mi or the module M(i+1) in accordance with an incoming control signal, and connects thus selected module to the input/output section Pi.

In accordance with a control signal coming from a control section that is not shown, for example, the module selection section (switch circuits SWA1 to SWA6 and SWB1 to SWB6) selects six modules in such a manner that any defective module found in the seven modules is disconnected from all of the input/output sections. When there is no defective module, a module provided in advance for redundancy use is disconnected.

Exemplified here is a case with an incoming control signal that designates that a module Mn (where n denotes an integer from 1 to 7) is to be disconnected from all of the input/output sections. In such a case, when n is an integer from 2 to 6, i.e., when the modules M2 to M6 are to be disconnected, the switch circuits SWA1 to SWA(n−1) are turned on but the switch circuits SWAn to SWA6 are turned off, and the switch circuits SWB1 to SWB(n−1) are turned off but the switch circuits SWBn to SWB6 are turned on.

When n is an integer 1, i.e., when the module M1 is to be disconnected, the switch circuits SWA1 to SWA6 are all turned off, and the switch circuits SWB1 to SWB6 are all turned on.

When n is an integer 7, i.e., when the module M7 is to be disconnected, the switch circuits SWA1 to SWA6 are all turned on, and the switch circuits SWB1 to SWB6 are all turned off.

Figure 5A:
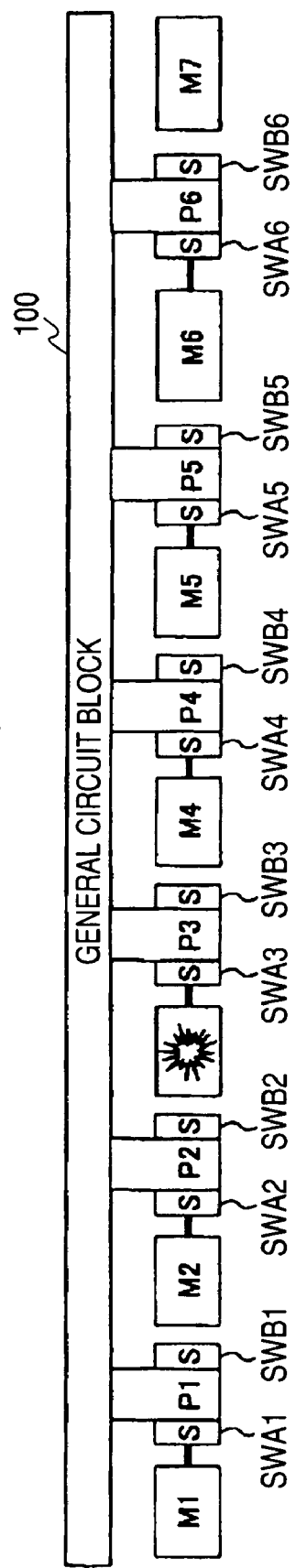
FIGS. 5A and 5B are both a diagram showing exemplary deficiency correction in the semiconductor integrated circuit.
Figure 5B:
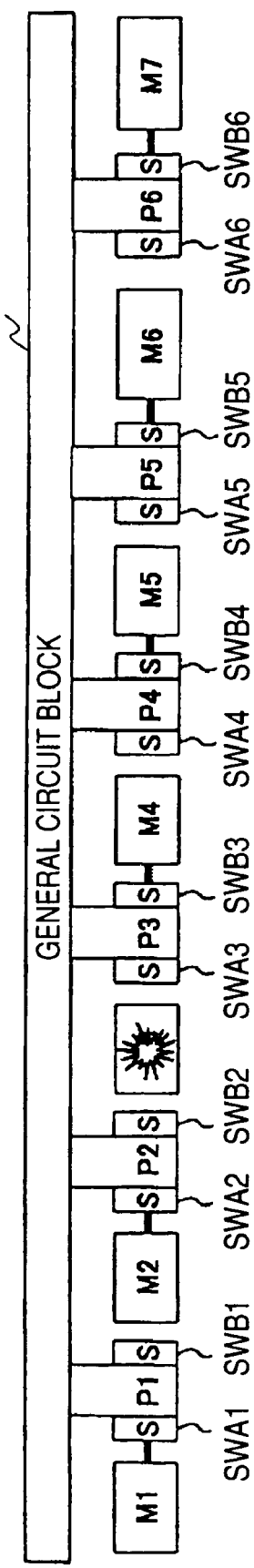

FIGS. 5A and 5B show the connection state when the module M3 is defective. In this case, the control section (not shown) generates a control signal to disconnect the module M3 from all of the input/output sections.

In response to the control signal, the switch circuits SWA1 and SWA2 are turned on but the switch circuits SWA3, SWA4, SWA5, and SWA6 are turned off, and the switch circuits SWB1 and SWB2 are turned off but the switch circuits SWB3, SWB4, SWB5, and SWB6 are turned on.

In response thereto, connections are established between the input/output section P1 and the module M1, the input/output section P2 and the module M2, the input/output section P3 and the module M4, the input/output section P4 and the module M5, the input/output section P5 and the module M6, and the input/output section P6 and the module M7. The module M3 is disconnected from the general circuit block 100.

Figure 6:
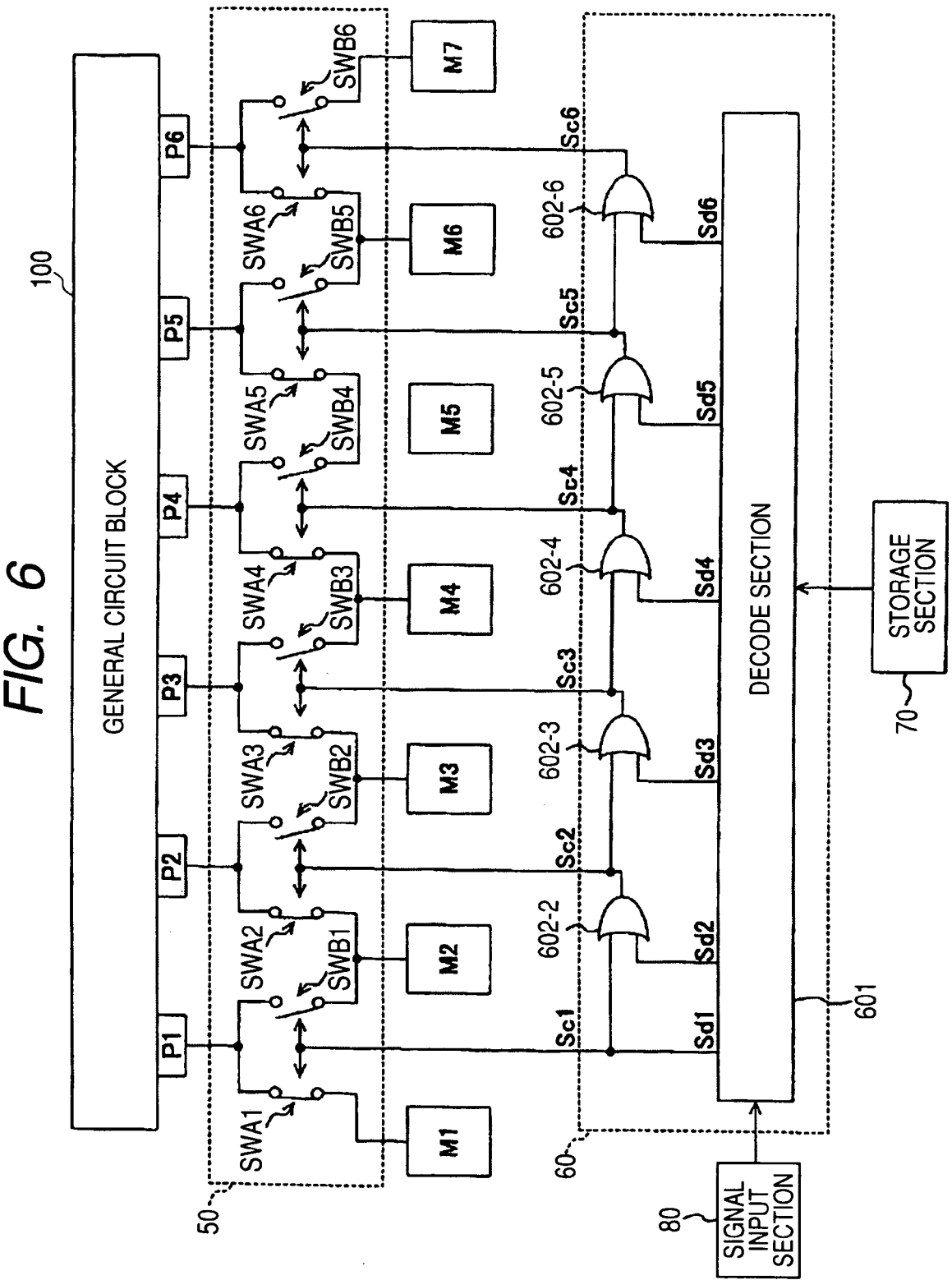
FIG. 6 is a diagram showing a more detailed exemplary configuration of the semiconductor integrated circuit.

FIG. 6 is a diagram showing a more detailed exemplary configuration of the semiconductor integrated circuit 1. In FIG. 6, any reference numeral same as that of FIG. 4 denotes the same component.

The semiconductor integrated circuit 1 of FIG. 6 is configured to include the modules M1 to M7, the general circuit block 100 including the input/output sections P1 to P6, a module selection section 50, a control section 60, a storage section 70, and a signal input section 80.

The module selection section 50 is an embodiment of the module selection section of the invention.

The signal input section 80 is an embodiment of the signal input section of the invention.

The storage section 70 is an embodiment of the storage section of the invention.

The control section 60 is an embodiment of the storage section of the invention.

The module selection section 50 selects six modules from the modules M1 to M7 in accordance with a control signal coming from the control section 60, and establishes a one-to-one connection between the selected six modules and the six input/output sections P1 to P6 of the general circuit block 100.

As exemplarily shown in FIG. 6, the module selection section 50 includes the switch circuits SWA1 to SWA6, and the switch circuits SWB1 to SWB6.

The switch circuit SWAi ($1 \leq i \leq 6$) is connected between the input/output section Pi and the module Mi. When a control signal Sci coming from the control section 60 takes a value of "0", the switch circuit SWAi is turned on, and is turned off if with a value of "1".

The switch circuit SWBi is connected between the input/output section Pi and the module M(i+1). When the control signal Sci takes a value of "0", the switch circuit SWBi is turned off, and is turned on if with a value of "1".

The switch circuit SWAi includes a circuit that turns on and off a signal to be transmitted from the input/output section Pi to the module Mi, and/or includes at least a circuit that turns on and off a signal to be transmitted from the module Mi to the input/output section Pi.

Similarly, the switch circuit SWBi includes a circuit that turns on and off a signal to be transmitted from the input/output section Pi to the module M(i+1), and/or includes at least a circuit that turns on and off a signal to be transmitted from the module M(i+1) to the input/output section Pi.

The control section 60 generates control signals Sc1 to Sc6, which exercise control over the module selection section 50. That is, the control section 60 generates, in a first operation mode, the control signals Sc1 to Sc6 in such a manner as to disconnect a module from all of the input/output sections (P1 to P6) as designated by a signal provided to the signal input section 80. The control section 60 generates, in a second operation mode, the control signals Sc1 to Sc6 in such a manner as to disconnect a module from all of the input/output sections (P1 to P6) as designated by information written in the storage section 70.

The control section 60 acknowledges the operation mode in an arbitrary manner, e.g., may acknowledge the operation mode with a signal to be applied to any predetermined terminal, or may acknowledge the operation mode with a flag value to be written in the storage section 70.

The first operation mode is mainly used when a module test is performed, and the second operation mode is used in the normal state after the module test is completely done.

When a signal coming from the signal input section 80 or information written in the storage section 70 is designating that the module Mn ($1 \leq n \leq 7$) is to be disconnected from all of the input/output sections, the control section 60 outputs the following control signals Sc1 to Sc6 in accordance with the value of an integer n.

[$2 \leq n \leq 6$]

In this case, the control section 60 sets the control signals Sc1 to Sc(n−1) to a value of "0", and the control signals Scn to Sc6 to a value of "1".

In response thereto, the switch circuits SWA1 to SWA(n−1) are turned on but the switch circuits SWAn to SWA6 are turned off, and the switch circuits SWB1 to SWB(n−1) are turned off but the switch circuits SWBn to SWB6 are turned on. This accordingly establishes a one-to-one connection between the modules M1 to M(n−1) and the input/output sections P1 to P(n−1), and another one-to-one connection is established between the modules M(n+1) to M7 and the input/output sections Pn to P6. The module Mn is disconnected from all of the input/output sections.

[n=1]

In this case, the control section 60 sets all of the control signals Sc1 to Sc6 to a value of "1".

In response thereto, the switch circuits SWA1 to SWA6 are all turned off, and the switch circuits SWB1 to SWB6 are all turned on. This accordingly establishes a one-to-one connection between the modules M2 to M7 and the input/output sections P1 to P6, and the module M1 is disconnected from all of the input/output sections.

[n=7]

In this case, the control section 60 sets all of the control signals Sc1 to Sc6 to a value of "0".

In response thereto, the switch circuits SWA1 to SWA6 are all turned on, and the switch circuits SWB1 to SWB6 are all turned off. This accordingly establishes a one-to-one connection between the modules M1 to M6 and the input/output sections P1 to P6, and the module M7 is disconnected from all of the input/output sections.

As exemplarily shown in FIG. 6, the control section 60 includes a decode section 601, and OR circuits 602-2 to 602-6.

The decode section 601 decodes a signal provided by the storage section 70 or the signal input section 80, and outputs the decoding result as signals Sd1 to Sd6.

That is, when information stored in the storage section 70 or the signal coming from the signal input section 80 is designating that the module Mn is to be disconnected from all of the input/output sections, the decode section 601 generates the following signals Sd1 to Sd6 in accordance with the value of an integer n.

When the value "n" takes an integer of 1 to 6, the signal Sdn is set to "1", and the remaining signals are set to "0".

When the value "n" takes an integer 7, the signals Sd1 to Sd6 are all set to a value of "0".

Because the signals Sd1 to Sd6 are those designating whether or not to disconnect any of the modules M1 to M7 from all of the input/output sections, the signals are hereinafter referred to as command signals Sd1 to Sd6.

The decode section 601 generates, in a first operation mode, i.e., operation mode at the time of a module test, the command signals Sd1 to Sd6 based on a signal provided by the signal input section 80. The decode section 601 generates, in a second operation mode, i.e., operation mode after the module test, the command signals Sd1 to Sd6 in accordance with information written in the storage section 70.

Note that, in FIG. 6 example, the command signal Sd1 provided by the decode section 601 is the same as the control signal Sc1 provided to the module selection section 50.

The OR circuits 602-2 to 602-6 are each an OR operation circuit including two inputs and one output, and in this order, connected to one another in a cascade manner.

In the OR circuit 602-2, one of the two inputs receives the command signal Sd1 (=control signal Sc1), and the other input receives the command signal Sd2. The output from the OR circuit 602-2 is supplied to the module selection section 50 as the control signal Sc2.

In the OR circuit 602-$k$ (where k denotes an integer from 3 to 6), one of the two inputs receives an output signal from the OR circuit 602-($k$−1), and the other input receives a command signal Sdk. The output of the OR circuit 602-$k$ is supplied to the module selection section 50 as the control signal Sck.

When a command signal Sdj (where j is an integer from 2 to 6) of the decode section 601 takes a value "1", the OR circuit 602-$j$ receiving the command signal Sdj outputs the control signal Scj of a value "1". When the value "j" is smaller than 6, all of the control signals Sc(j+1) to Sc6 take a value of "1", which are those provided by the OR circuits 602-($j$+1) to 602-6 in the stage subsequent to the OR circuit 602-$j$.

When the command signal Sd1 (=control signal Sc1) of the decode section 601 takes a value of "1", the OR circuit 602-2 receiving the command signal Sd1 outputs the control signal Sc2 of a value "1". All of the control signals Sc3 to Sc6 take a value of "1", which are those provided by the OR circuits 602-3 to 602-6 in the stage subsequent to the OR circuit 602-2.

On the other hand, when the command signals (Sd1 to Sd6) of the decode section 601 all take a value of "0", the input/output signals of the OR circuits 602-2 to 602-6 all take a value of "0" so that the control signals (Sc1 to Sc6) to be provided to the module selection section 50 all take the value of "0".

Accordingly, when the module Mn is disconnected from all of the input/output sections, when the value "n" takes an integer from 2 to 6, the decode section 601 sets a value "0" to the command signals Sd1 to Sd(n−1), a value "1" to the command signal Sdn, and the value "0" to the command signals Sd(n+1) to Sd6. The control signals Sc1 to Sc(n−1) thus take the value of "0", and the control signals Scn to Sc6 take the value of "1". When the value "n" takes an integer 1, the decode section 601 sets a value "1" to the command signal Sd1 so that the control signals Sc1 to Sc6 thus all take the value of "1". When the value "n" takes an integer 7, the decode section 601 sets a value "0" to the command signals Sd1 to Sd6 so that the control signals Sc1 to Sc6 thus all take the value of "0".

The storage section 70 stores therein information designating which of the seven modules (M1 to M7) is to be disconnected from all of the input/output sections (P1 to P6).

The storage section 70 may be configured by a fuse element or a nonvolatile memory, for example.

The signal input section 80 is a circuit for receiving a signal designating which module is to be disconnected from all of the input/output sections (P1 to P6), and is used for signal input from any external device to the control section 60 at the time when the semiconductor integrated circuit 1 is tested, for example.

The above-described semiconductor integrated circuit 1 of FIGS. 4 and 6 carries therein only one redundant module, and thus is not able to correct two or more deficiencies. If with a high possibility of deficiency, it may not be possible to achieve a sufficient yield unless the number of correctable deficiencies is increased.

In consideration thereof, as shown in FIGS. 4 and 6, the semiconductor integrated circuit 1 of the present embodiment may be plurally provided with a group of modules (a module block) that is able to correct one deficiency.

Figure 7:
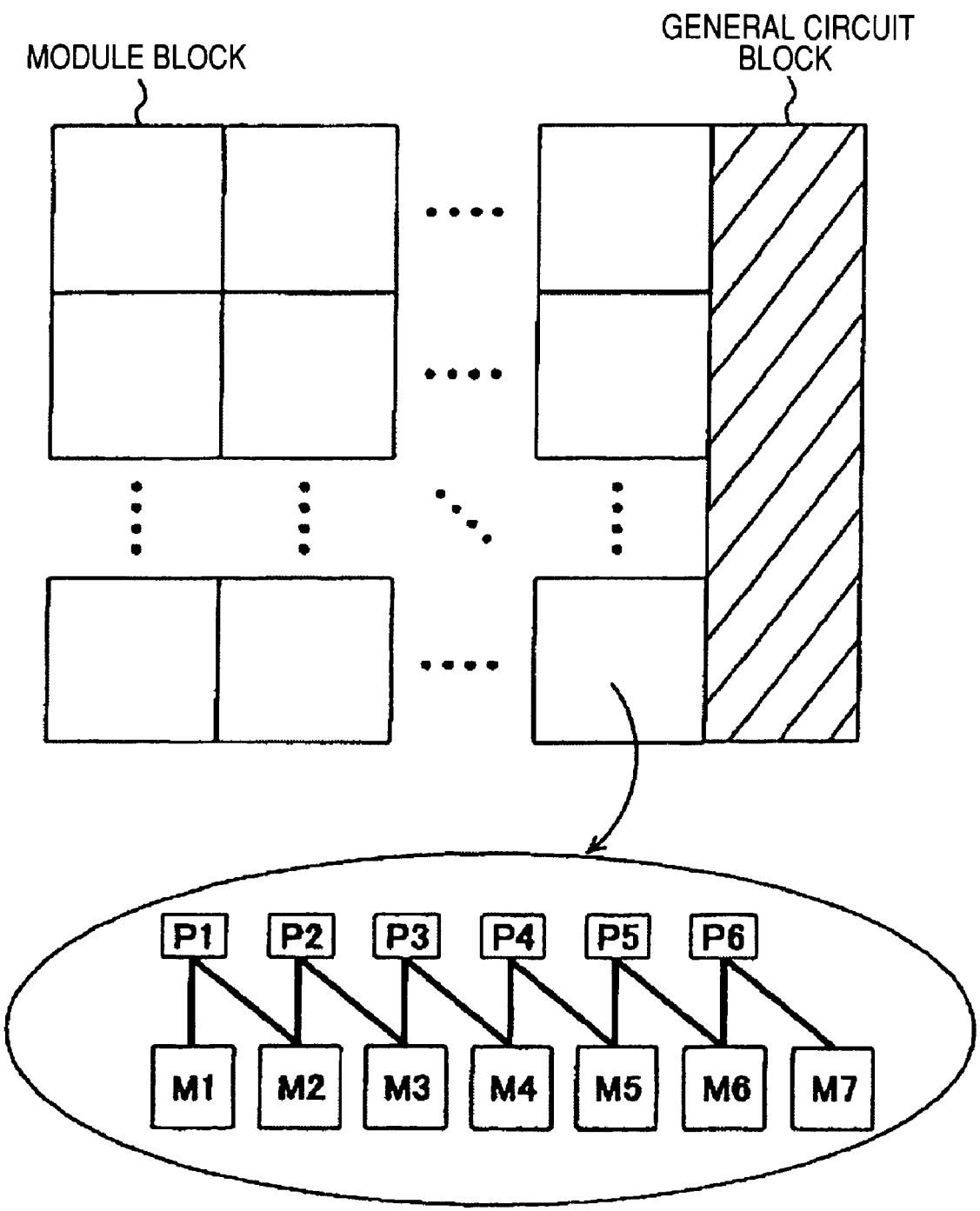
FIG. 7 is a diagram showing an exemplary semiconductor integrated circuit including a plurality of module blocks.

FIG. 7 is a diagram showing an exemplary semiconductor integrated circuit 1 including a plurality of module blocks.

The module blocks are each provided with N (where N is an integer larger than 2) modules being substitutable in terms of function for one another, and a module selection section that selects (N−1) modules from the N modules for establishing a one-to-one connection with the (N−1) input/output sections of the general circuit module 100.

The module blocks may be systematically arranged as shown in FIG. 7, or may be arranged in any freely-shaped area.

With a plurality of module blocks and a module selection section as such, it becomes able to correct more deficiencies in the semiconductor integrated circuit.

Moreover, with a plurality of module blocks, it becomes able to correct deficiencies for various types of modules. This serves well for a case where there are a plurality of module groups being substitutable in terms of function for one another because function substitution is possible among the modules in the same module group. However, there may be a case where function substitution is not allowed among the modules not in the same module group. If this is the case, each of the module groups may be formed with a plurality of module blocks including a redundant module, and deficiency correction may be made for each of the module blocks so that deficiencies can be favorably corrected for various types of modules.

This is the end of the description about the semiconductor integrated circuit 1.

Described next is the components of the test device of FIG. 1.

The control section 3 generates a control signal of the semiconductor integrated circuit 1, without changing a function to be assigned to the whole of the modules in the semiconductor integrated circuit 1, to make the function change for assignment to each of the modules at least in a group of the modules.

When the determination section 2 determines that the group of the modules in the semiconductor integrated circuit 1 includes any module being defective (hereinafter, referred to as defective module), the control section 3 generates a control signal, without changing the function to be assigned to the whole of the modules of the semiconductor integrated circuit 1, to make the function change for assignment to each of the modules at least in a part of the group of the modules.

The determination section 2 detects whether the semiconductor integrated circuit 1 operates differently after the function change is made for assignment to any of the modules by the control section 3, and based on the detection result, determines whether or not the group of the modules through with the function change includes a defective module.

When the control section 3 makes a function change for assignment to each of the modules in a part of the group of the modules, the determination section 2 detects whether the semiconductor integrated circuit 1 operates differently as a result of the function change, and based on the detection result, determines whether the defective module is included in the part of the group of the modules or in the remaining part of the group of the modules.

After the range for search is narrowed down as such, when the group of the modules determined as including the defective module carries three of the modules, the determination section 2 detects whether the semiconductor integrated circuit 1 operates differently when the control section 3 makes the function change between two of the modules in the group of the modules, and whether the semiconductor integrated circuit 1 operates differently when the control section 3 makes the function change between the remaining one of the modules in the group of the modules and either of the two modules. Based on the detection result, the defective module in the module group of three modules is identified.

Assuming here is that the semiconductor integrated circuit 1 includes module blocks as shown in FIGS. 4 and 6. In this case, the control section 3 generates a control signal for the semiconductor integrated circuit 1 to make a state change, i.e., between a state in which the module M1 is disconnected from all of the input/output sections (P1 to P6) and a state in which the module M7 is disconnected from all of the input/output sections. After such a state change, a function change is made for assignment to each of the modules M1 and M7.

When the semiconductor integrated circuit 1 operates differently in response to such a state change, the determination section 2 determines that any of the modules M1 to M7 is defective.

When any of the modules M1 to M7 is determined as being defective, the control section 3 generates a control signal to disconnect any one of these modules, e.g., module M4, from all of the input/output sections (P1 to P6).

The determination section 2 then detects whether or not the semiconductor integrated circuit 1 operates differently after a state change, i.e., between a state in which the module M1 is disconnected from all of the input/output sections and a state in which the module M4 is disconnected from all of the input/output sections, and/or the semiconductor integrated circuit 1 operates differently after a state change, i.e., between a state in which the module M7 is disconnected from all of the input/output sections and a state in which the module M4 is disconnected from all of the input/output sections. Based on the detection result, the determination section 2 determines which module group includes a defective module, i.e., a group of modules M1 to M4 or M5 to M7, or determines which module group includes a defective module, i.e., a group of modules M1 to M3 or M4 to M7.

When the determination section 2 determines that a module group of Mp (where p is an integer from 1 to 6) to Mq (where q is an integer from (p+1) to 7) includes a defective module, the control section 3 selects a module Mr (where r is an integer from p to q) therefrom, and generates a control signal to disconnect the module Mr from all of the input/output sections.

The determination section 2 then detects whether the semiconductor integrated circuit 1 operates differently after a state change, i.e., between a state in which the pth module is disconnected from all of the input/output sections and a state in which the rth module is disconnected from all of the input/output sections, and/or whether the semiconductor integrated circuit 1 operates differently after a state change, i.e., between a state in which the qth module is disconnected from all of the input/output sections and a state in which the rth module is disconnected from all of the input/output sections. Based on the detection result, the determination section 2 determines which module group includes a defective module, i.e., a group of modules pth to rth or (r+1)th to qth, or determines which module group includes a defective module, i.e., a group of modules pth modules to (r−1)th or rth to qth.

By repeating such a process in a similar manner, the range for defective module search is narrowed down.

After the range for search is narrowed down as such, when the group of the modules determined as including a defective module carries three of the modules (Mp, Mr, and Mq), the determination section 2 detects whether the semiconductor integrated circuit 1 operates differently after a state change, i.e., between a state in which the module Mp is disconnected from all of the input/output sections and a state in which the module Mr is disconnected from all of the input/output sections, and whether the semiconductor integrated circuit 1 operates differently after a state change, i.e., between a state in which the module Mq is disconnected from all of the input/output sections and a state in which the module Mr is disconnected from all of the input/output sections. Based on the detection result, a defective module is identified.

The signal generation section 4 generates a predetermined test signal (test pattern) for supply to the semiconductor integrated circuit 1. The test pattern is the one changing a response signal sequence depending on a function change made to each of the modules in the semiconductor integrated circuit 1.

Based on the change observed in the response signal sequence of the semiconductor integrated circuit 1 in response to the test pattern provided by the signal generation section 4, the determination section 2 detects whether the semiconductor integrated circuit 1 operates differently.

The normal output value storage section 5 stores therein a normal signal output value f, which is supposed to be output by the normally-operating semiconductor integrated circuit 1 in accordance with the test pattern of the signal generation section 4.

When the response signal sequence f is provided by the semiconductor integrated circuit 1, the determination section 2 determines that the semiconductor integrated circuit 1 is operating normally.

The test response storage section 6 temporarily stores therein the response signal sequence coming from the semiconductor integrated circuit 1 in accordance with the test pattern of the signal generation section 4.

Using the response signal sequence stored in the test response storage section 6, the determination section 2 detects any change observed in the response signal sequence coming from the semiconductor integrated circuit 1.

Described here is the operation of the test device configured as such as shown in FIG. 1.

First of all, described are the problems to be caused when a defective module is identified in the semiconductor integrated circuit 1 including a plurality of module blocks, and a method of identifying a defective module by the test device of FIG. 1.

Figure 8A:
FIGS. 8A and 8B are both a diagram for illustrating a problem in a case with a plurality of module blocks.
Figure 8B:
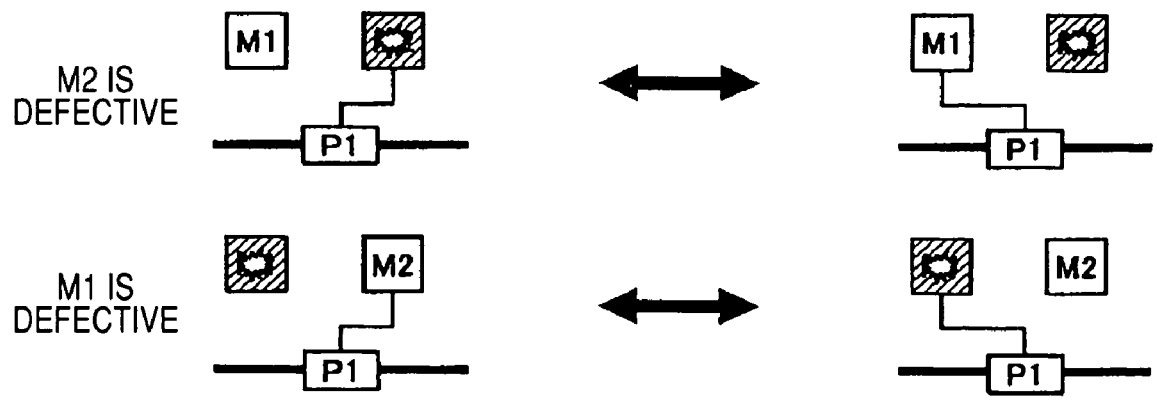

FIGS. 8A and 8B are both a diagram showing an exemplary module block including two modules of M1 and M2. With the module block of FIG. 8A, either the module M1 or M2 is connected to an input/output section P1 of the general circuit block 100.

In the following description, the response signal sequence when the module Mn is disconnected from all of the input/output section is denoted as "$f^{Mn}(x)$" or "$f^{Mn}$".

When the semiconductor integrated circuit 1 includes only one module block as shown in FIG. 8A, even if either the module M1 or M2 is defective, the output signal sequence of the semiconductor integrated circuit 1 can be made equal to the normal output value f by changing the connection of the modules M1 and M2 with the input/output section P1. This thus enables to identify a defective module with ease.

With a plurality of module blocks, however, only changing the connection of the module blocks is not enough to identify a defective module. This is because, as shown in FIG. 8B, the response signal sequences $f^{M1}(x)$ and $f^{M2}(x)$ have each different value, which is not the normal output value f.

In consideration thereof, the test device of FIG. 1 identifies a defective module with the following method.

With the method, assumed is that a module block includes at most one defective module. Because only one module can be corrected for its deficiency in a module block, if a module block includes a plurality of defective modules, the modules cannot be entirely corrected for their deficiencies. As a result, the semiconductor integrated circuit 1 becomes defective. In this sense, when with a plurality of defective modules, even if a determination is erroneously made when these defective modules are dealt as a piece, e.g., a normal module is determined as being defective, the circuit will be defective in its entirety so that there is no problem.

FIGS. 9A to 10C are all a diagram for illustrating a method of identifying a defective module in the test device of FIG. 1.

The module blocks of FIGS. 9A to 10C each include three modules of M1, M2, and M3, all of which are connectable to the input/output sections P1 and P2 of the general circuit block 100.

In the Boolean algebra expressions of FIGS. 9A to 10C, "Mn" denotes a logical variable representing whether the module Mn is defective or not. When the module Mn is normal, "Mn=0" is established, and when the module Mn is defective, "Mn=1" is established.

Figure 9A:
FIGS. 9A to 9C are all a first diagram for illustrating a method of identifying a defective module in the test device of FIG. 1.
Figure 9B:
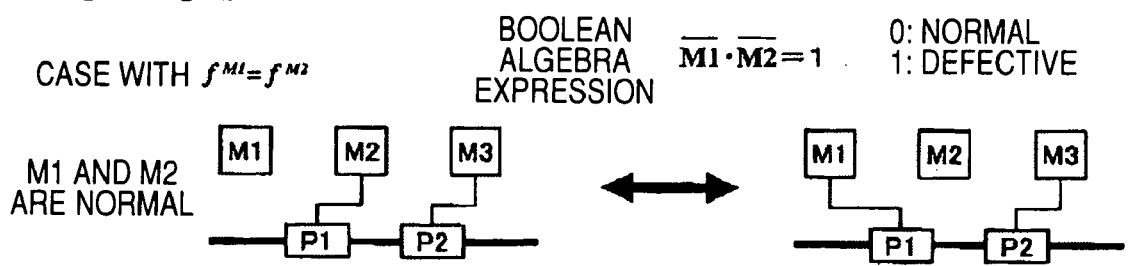
Figure 9C:
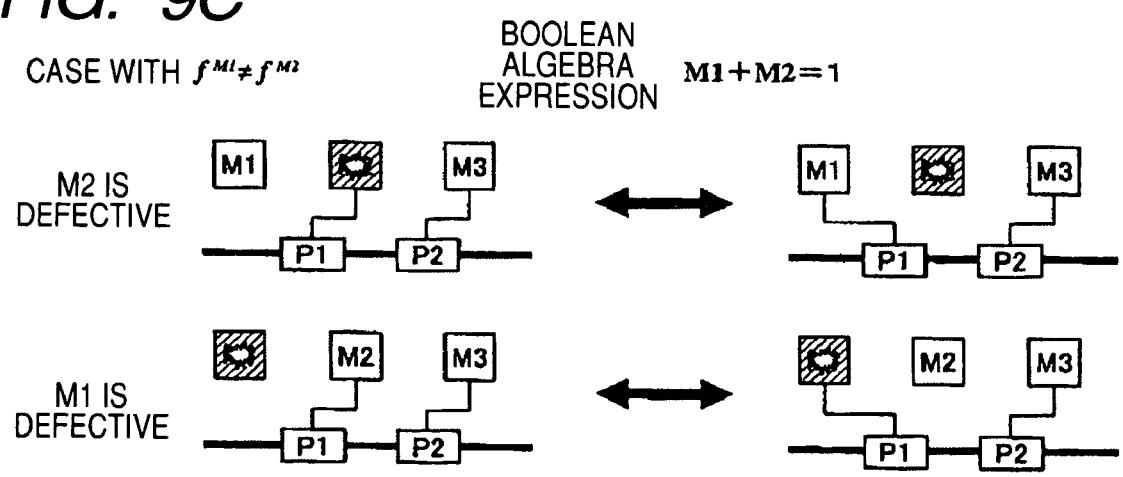

In FIGS. 9A to 9C, considered is the relationship between the response signal sequences $f^{M1}$ and $f^{M2}$ when the modules M1 and M2 are disconnected from the input/output section P1, respectively.

The modules M1 and M2 are connected to the same input/output section P1. With such a configuration, when the response signal sequences $f^{M1}$ and $f^{M2}$ are the same, it is known that the function exchange between the modules M1 and M2 does not affect the semiconductor integrated circuit 1 in terms of function, i.e., the modules M1 and M2 have the same function. In this case, although the modules M1 and M2 may be both normal or defective, the modules M1 and M2 are determined as being both normal (FIG. 9B). This is because, as described above, it is assumed that a module block includes at most one defective module.

On the other hand, when the response signal sequences $f^{M1}$ and $f^{M2}$ are not the same, it is known that the function exchange between the modules M1 and M2 affects the semiconductor integrated circuit 1 in terms of function, i.e., the modules M1 and M2 each have a different function. In this case, either the module M1 or M2 is determined as being defective (FIG. 9C).

Figure 10A:
FIGS. 10A to 10C are all a second diagram for illustrating another method of identifying a defective module in the test device of FIG. 1.
Figure 10B:
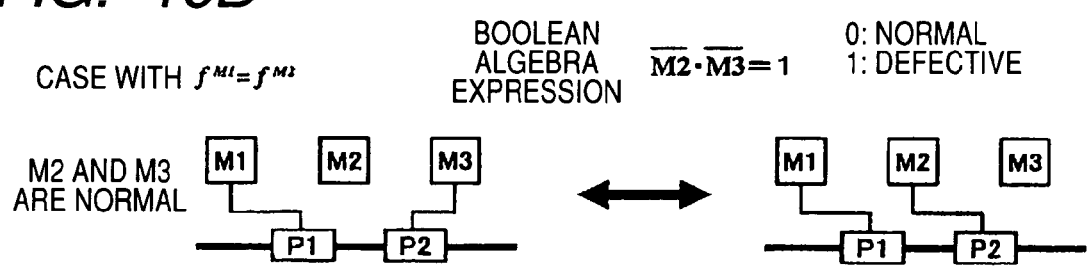
Figure 10C:
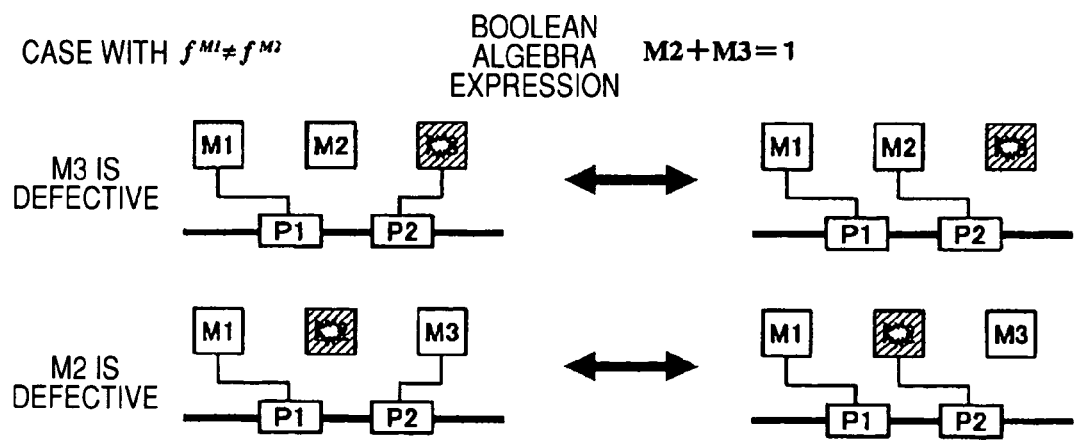

In FIGS. 10A to 10C, considered is the relationship between the response signal sequences $f^{M2}$ and $f^{M3}$ when the modules M2 and M3 are disconnected from the input/output section P2, respectively.

The modules M2 and M3 are connected to the same input/output section P2. With such a configuration, when the response signal sequences $f^{M2}$ and $f^{M3}$ are the same, it is known that the function exchange between the modules M2 and M3 does not affect the semiconductor integrated circuit 1 in terms of function, i.e., the modules M2 and M3 have the same function. In this case, although the modules M2 and M3 may be both normal or defective, the modules M2 and M3 are determined as being both normal (FIG. 10B). This is because, as described above, it is assumed that a module block includes at most one defective module.

On the other hand, when the response signal sequences $f^{M2}$ and $f^{M3}$ are not the same, it is known that the function exchange between the modules M2 and M3 affects the semiconductor integrated circuit 1 in terms of function, i.e., the modules M2 and M3 each have a different function. In this case, either the module M2 or M3 is determined as being defective (FIG. 10C).

When the response signal sequences $f^{M1}$ and $f^{M2}$ are the same, and when the response signal sequences $f^{M2}$ and $f^{M3}$ are the same, the following expression is derived based on the Boolean algebra expressions of FIGS. 9B and 10B.

$$<f^{M1}=f^{M2} \text{ and } f^{M2}=f^{M3}>(\overline{M1 \cdot M2}) \cdot (\overline{M2 \cdot M3})=\overline{M1 \cdot M2} \cdot \overline{M3} \quad (1)$$

With Expression 1, every module is determined as being normal. There may be a possibility that every module is similarly defective. If this case, the number of defective module exceeds one so that no deficiency correction is possible.

When the response signal sequences $f^{M1}$ and $f^{M2}$ are the same, and when the response signal sequences $f^{M2}$ and $f^{M3}$ are not the same, the following expression is derived based on the Boolean algebra expressions of FIGS. 9B and 10C.

$$<f^{M1}=f^{M2} \text{ and } f^{M2} \neq f^{M3}>(\overline{M1\cdot M2})\cdot(M2+M3)=\overline{M1}\cdot\overline{M2}\cdot M2+\overline{M1}\cdot\overline{M2}\cdot M3=\overline{M1}\cdot\overline{M2}\cdot M3=1 \quad (2)$$

With Expression 2, the module M3 is determined as being defective.

When the response signal sequences $f^{M1}$ and $f^{M2}$ are not the same, and when the response signal sequences $f^{M2}$ and $f^{M3}$ are the same, the following expression is derived based on the Boolean algebra expressions of FIGS. 9C and 10B.

$$<f^{M1}\neq f^{M2} \text{ and } f^{M2}=f^{M3}>(M1+M2)\cdot(\overline{M2+M3})=M1\cdot\overline{M2}\cdot\overline{M3}+M2\cdot\overline{M2}\cdot\overline{M3}=M1\cdot\overline{M2}\cdot\overline{M3}=1 \quad (3)$$

With Expression 3, the module M1 is determined as being defective.

Lastly, when the response signal sequences $f^{M1}$ and $f^{M2}$ are not the same, and when the response signal sequences $f^{M2}$ and $f^{M3}$ are not the same, the following expression is derived based on the Boolean algebra expressions of FIGS. 9C and 10C.

$$<f^{M1} \neq f^{M2} \text{ and } f^{M2} = f^{M3}> \quad (4)$$
$$(M1+M2)\cdot(M2+M3) = M1\cdot M2 + M1\cdot M3 + M2\cdot M3$$
$$= M1\cdot M3 + M2(1+M1+M3)$$
$$= M1\cdot M3 + M2$$
$$= 1$$

With Expression 4, only the module M2 is determined as being defective, or the modules M1 and M3 are both determined as being defective. With the latter determination, however, the number of defective modules in the module block exceeds one so that no deficiency correction is possible. Therefore, in this case, only the module M2 is determined as being defective.

Figures 11, 12:
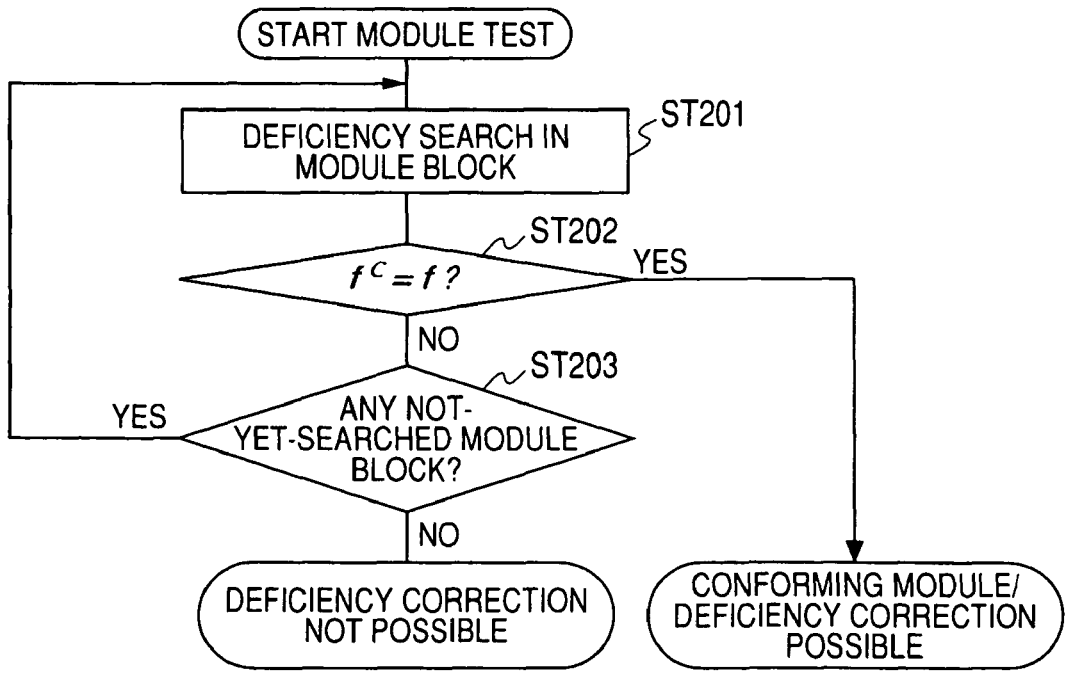
FIG. 11 is a list diagram showing the methods of identifying a defective module of FIGS. 9A to 10C.
FIG. 12 is a flowchart of an exemplary module test process in its entirety.

FIG. 11 is a diagram collectively showing the results of Expressions 1 to 4. As is known from FIG. 11, based on any change observed in the response signal sequence as a result of the function change made to any of the modules, it is possible to identify a module being a correction target, i.e., defective module.

By referring to the flowcharts of FIGS. 12 and 13, described next is an exemplary module test process in the test device of FIG. 1.

FIG. 12 is a flowchart of an exemplary module test process in its entirety.

First of all, the test device searches any defective module in module blocks in the semiconductor integrated circuit 1 (step ST201, FIG. 12).

The test device corrects any deficiency based on the search result of step ST201, and determines whether the response signal sequence of the semiconductor integrated circuit 1 is the same as the normal output value f (step ST202). When the response signal sequence is the same as the normal output value f, the test device outputs a determination result telling that the deficiency correction is possible in the semiconductor integrated circuit 1 (including a case where every module is normal), and this is the end of the test process (step ST202).

On the other hand, when the response signal sequence of the semiconductor integrated circuit 1 is not the same as the normal output value f, and when there is any module block not yet searched for deficiency, the procedure returns to the defective module search process of step ST201, and goes through the defective module search process for the not-yet-searched module block(s).

When the response signal sequence of the semiconductor integrated circuit 1 is not the same as the normal output value f, and when every module is through with the defective module search process, the test device outputs a determination result telling that no deficiency correction is possible in the semiconductor integrated circuit 1, and this is the end of the test process (step ST203).

Figure 13:
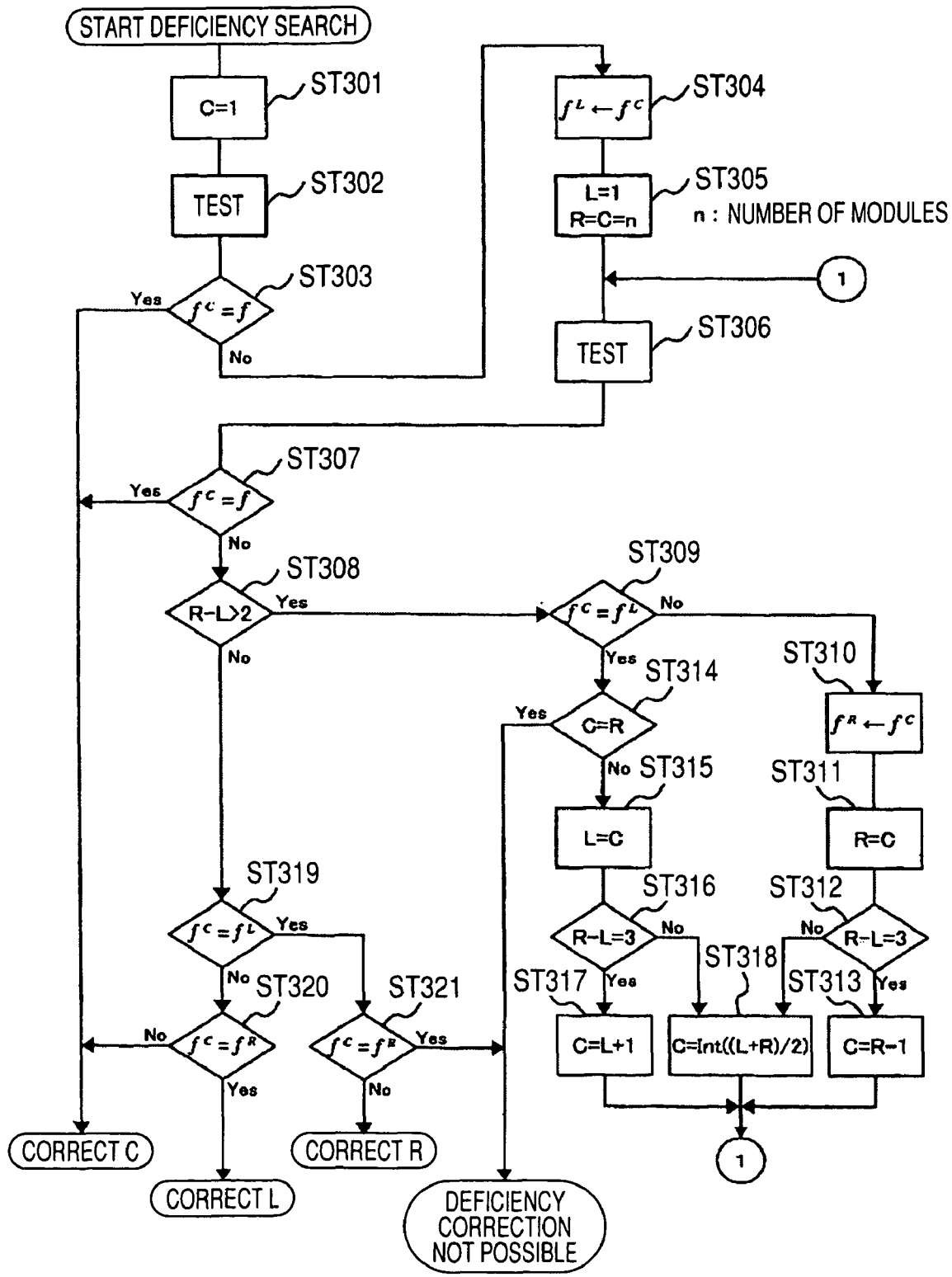
FIG. 13 is a flowchart of an exemplary defective module search process.

FIG. 13 is a flowchart of an exemplary defective module search process (step ST201) in the module test process of FIG. 12.

In the flowchart of FIG. 13, step ST305 is an embodiment of the first step of the invention.

Step ST309 is an embodiment of the second step of the invention.

Steps ST311 to ST313, and steps ST315 to ST318 are each an embodiment of the third step of the invention.

Steps ST308, ST319, ST320, and ST321 are each an embodiment of the fourth step of the invention.

By referring to specific examples if with a defective module (FIGS. 14 to 21), described below is a defective module search process of FIG. 13.

Figure 19:
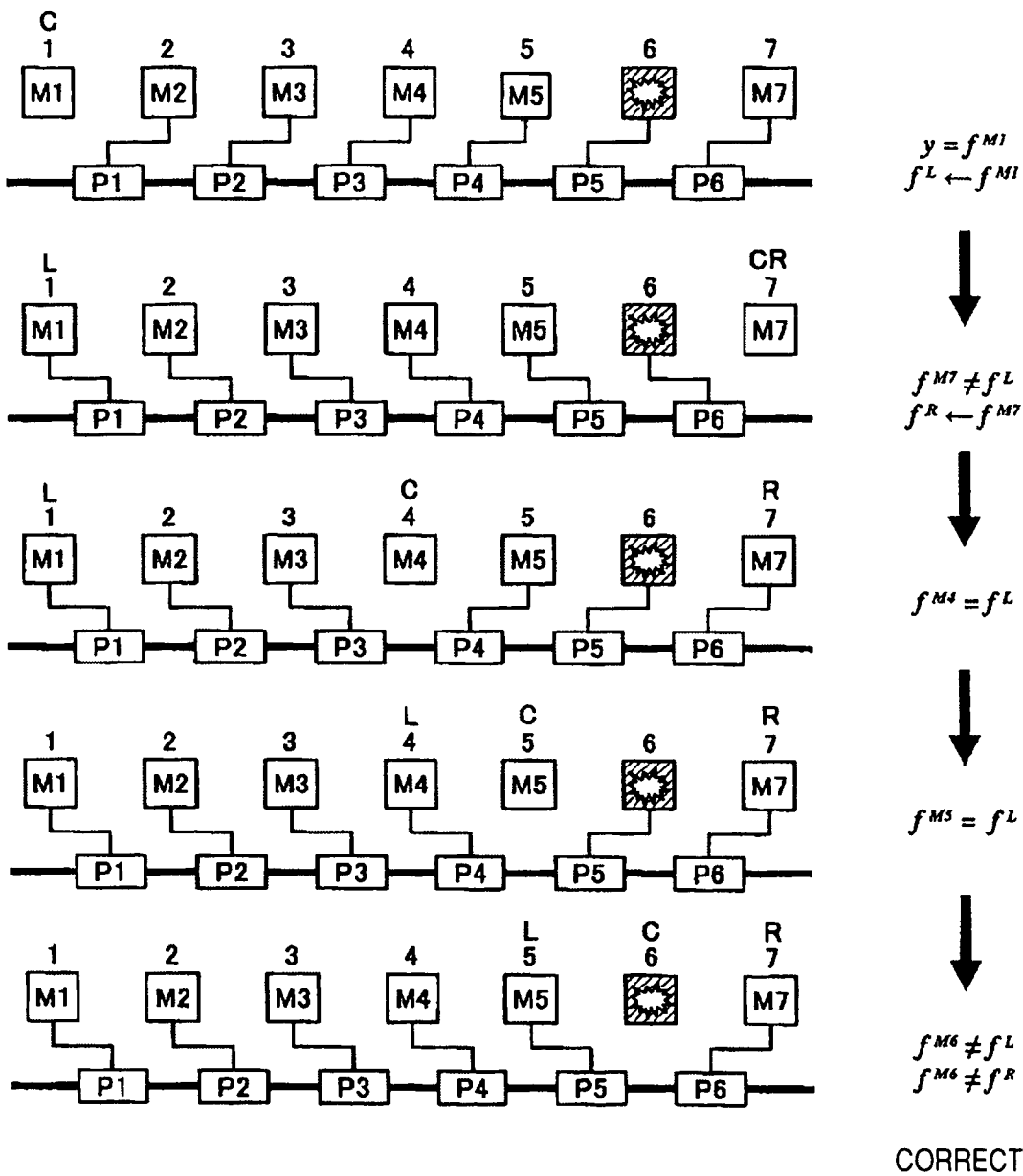
FIG. 19 is a sixth diagram illustrating still another specific example of the defective module search process if with a defective module.
Figure 20:
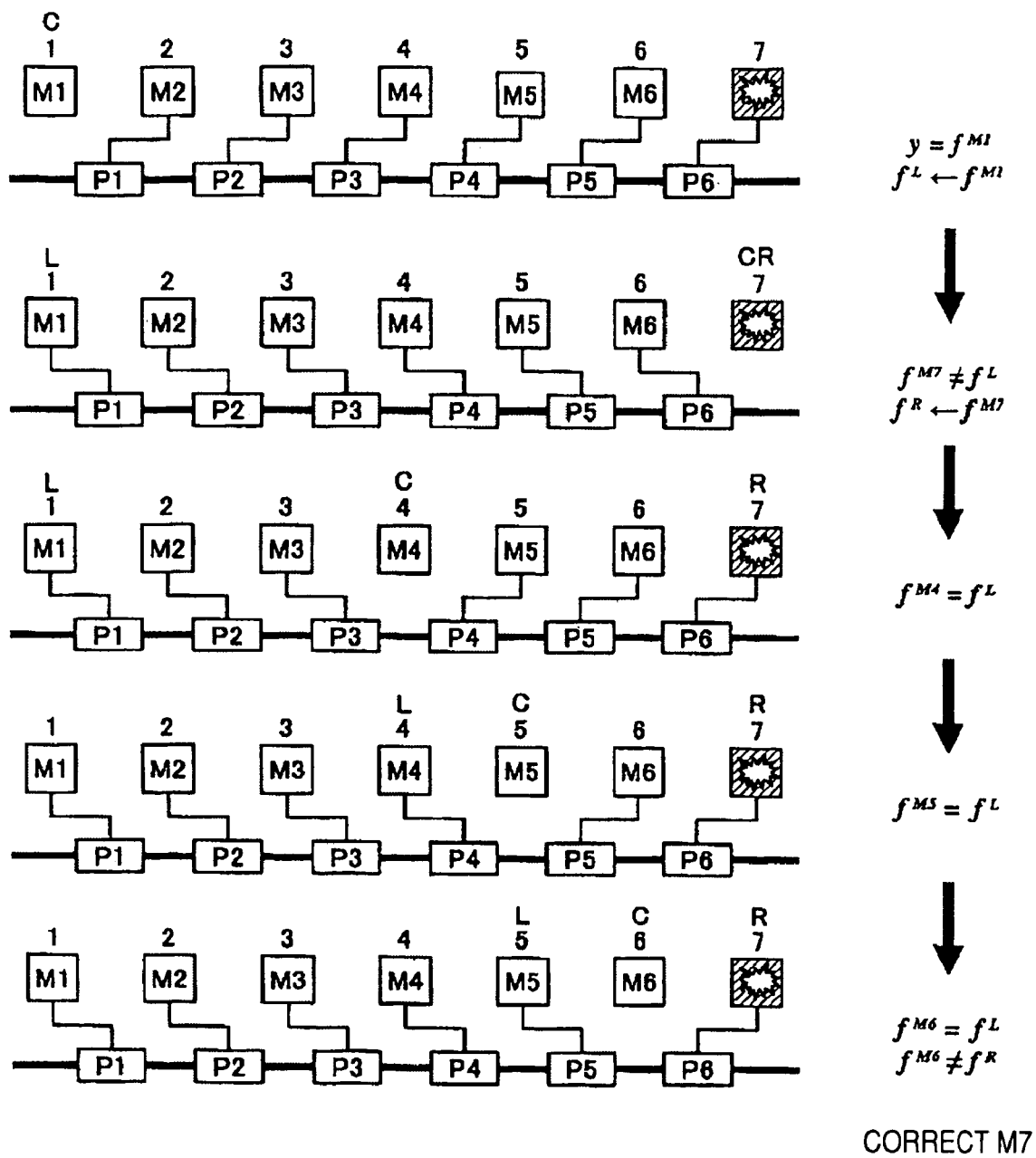
FIG. 20 is a seventh diagram illustrating still another specific example of the defective module search process if with a defective module.
Figure 21:
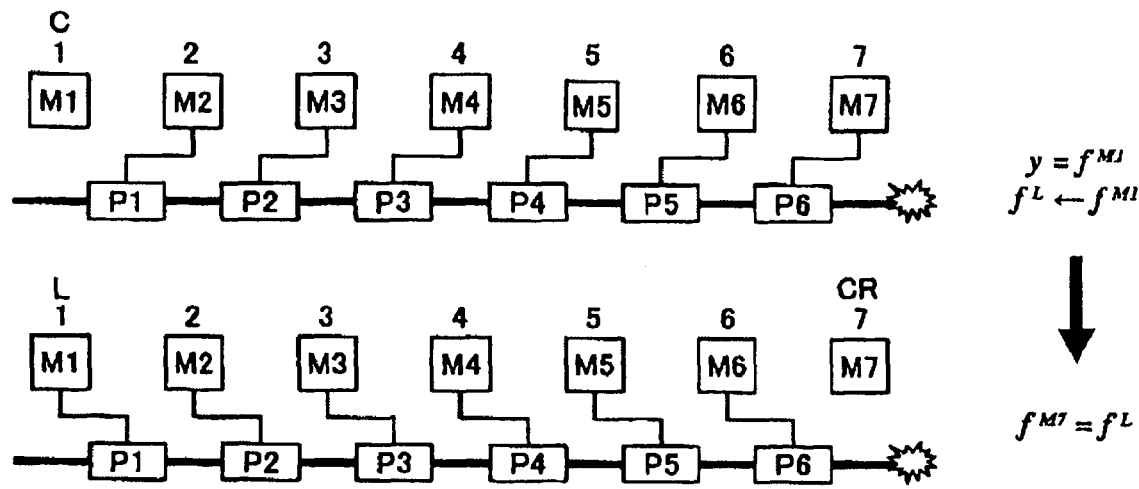
FIG. 21 shows an exemplary deficiency process when any component other than modules is defective.

FIGS. 14 to 20 each show an exemplary defective module search process when any of the modules M1 to M7 is defective, and FIG. 21 shows an exemplary defective process when any component other than modules is defective.

Note that, in FIGS. 14 to 20, "L" denotes the module number on the left end of the range for search, "R" denotes the module number on the right end of the range for search, and "C" denotes the module number to be disconnected from all of the input/output sections. Note here that the number of the module Mn is "n", and for example, the number of the module M4 is "4".

In the below, "$f^L$" denotes a response signal sequence when the module showing the number of L is disconnected from all of the input/output sections.

"$f^R$" denotes a response signal sequence when the module showing the number of R is disconnected from all of the input/output sections.

"$f^C$" denotes a response signal sequence when the module showing the number of C is disconnected from all of the input/output sections.

Figure 14:
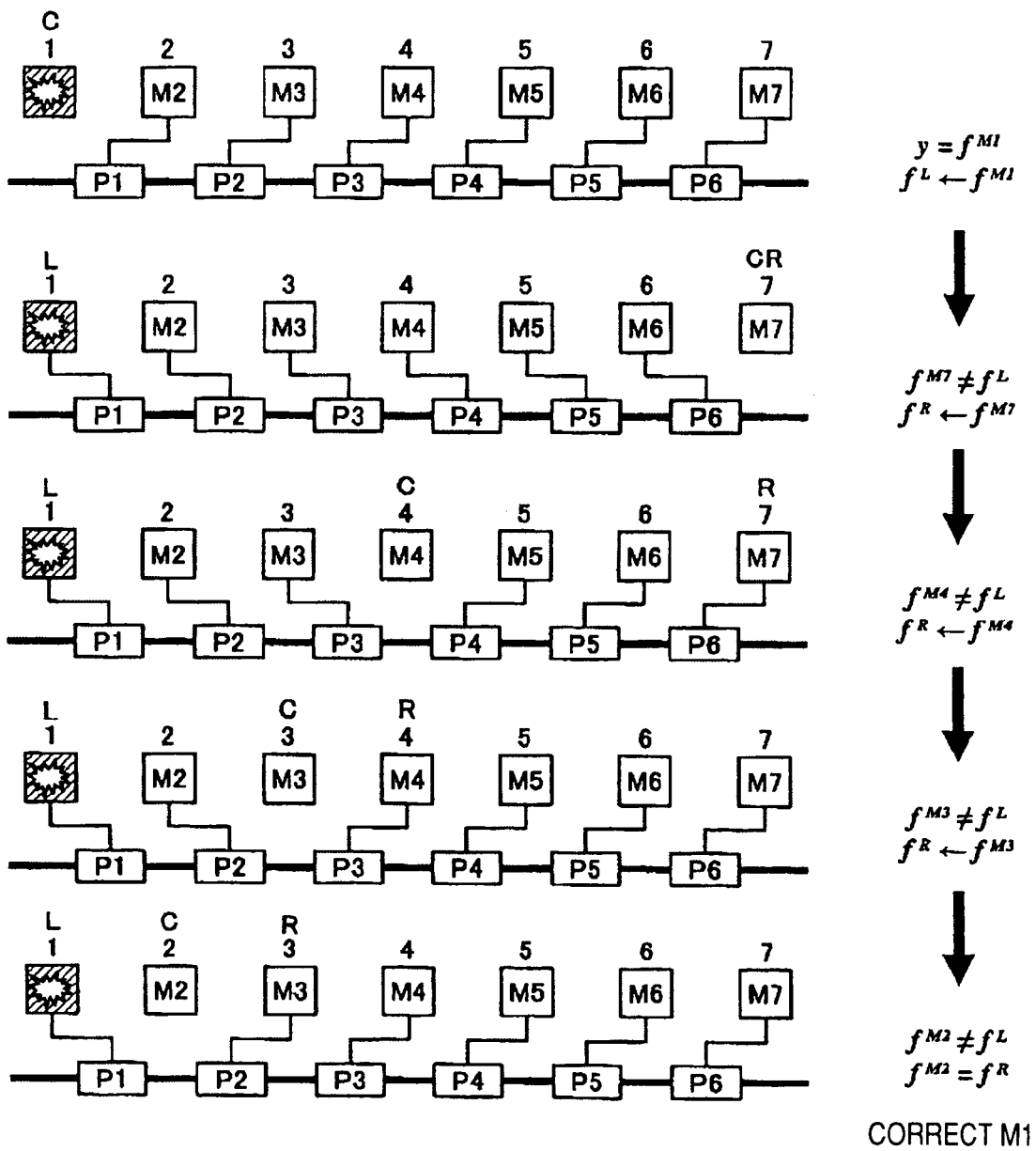
FIG. 14 is a first diagram illustrating a specific example of the defective module search process if with a defective module.

1. Case when Module M1 is Defective (FIG. 14)

The control section 3 first makes a setting of "C=1" (step ST301), and disconnects the module M1 from all of the input/output sections. In this state, the signal generation section 4 inputs a test pattern x to the semiconductor integrated circuit 1, and the determination section 2 captures the resulting response signal sequence $f^C(f^{M1})$ (step ST302). The determination section 2 compares thus captured response signal sequence $f^C$ with the normal output value f stored in the normal output value storage section 5. When the comparison result tells that the captured response signal sequence is the same as the normal output value, the module M1 is determined as a correction target, and this is the end of the defective module search process (step ST303).

The captured response signal sequence $f^C$ is the same as the normal output value f when every module block is through with deficiency correction (including a case with no deficiency). When any other module blocks include a defective module, the captured response signal sequence $f^C$ is not the same as the normal output value f, and thus the defective module search process is continued. In this example, the process is presumed to be continued. The test response storage section 6 stores therein the response signal sequence $f^C(f^{M1})$ derived in step ST302 as "$f^L$" (step ST304).

The control section 3 then makes settings of "L=1", and "C=R=7", and disconnects the module M7 from all of the input/output sections (step ST305). In this state, the signal generation section 4 inputs a test pattern x to the semiconductor integrated circuit 1, and the determination section 2 captures the resulting response signal sequence $f^C(f^{M7})$ (step ST306). The determination section 2 compares thus captured response signal sequence $f^C(f^{M7})$ with the normal output value f, but because the defective module M1 is connected to the input/output section P1, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M7})$ captured in step ST306 with the response signal sequence $f^L(f^{M1})$ stored in the test response storage section 6. Because these are not the same, the determination section 2 determines that any of the modules M1 to M7 is defective. The test response storage section 6 stores therein the response signal sequence $f^C(f^{M7})$ derived in step ST306 as "$f^R$" (step ST310).

The control section 3 then makes a setting of "R=C=7" (step ST311). The determination section 2 then makes a determination whether there are four modules in the range for search (L to R) (step ST312). Because there are not four modules, the procedure goes to step ST318. In step ST318, the control section 3 calculates "Int((L+R)/2)". Note here that "Int(α)" denotes a maximum integer not exceeding "α". Based on the calculation result, the control section 3 makes a setting of "C=4", and disconnects the module M4 from all of the input/output sections. In this state, the signal generation section 4 inputs a test pattern x to the semiconductor integrated circuit 1, and the determination section 2 captures the resulting response signal sequence $f^C(f^{M4})$ (step ST306). The determination section 2 compares thus captured response signal sequence $f^C(f^{M4})$ with the normal output value f, but because the defective module M1 is connected to the input/output section P1, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M4})$ captured in step ST306 with the response signal sequence $f^L(f^{M1})$ stored in the test response storage section 6. Because these are not the same, the determination section 2 determines that any of the modules M1 to M4 is defective. The test response storage section 6 stores therein the response signal sequence $f^C(f^{M4})$ derived in step ST306 as "$f^R$" (step ST310).

The control section 3 then makes a setting of "R=C=4" (step ST311). The determination section 2 then makes a determination whether there are four modules in the range for search (L to R) (step ST312). Because there are four modules, the procedure goes to step ST313. In step ST313, the control section 3 makes a setting of "C=R−1=3", and disconnects the module M3 from all of the input/output sections. In this state, the signal generation section 4 inputs a test pattern x to the semiconductor integrated circuit 1, and the determination section 2 captures the resulting response signal sequence $f^C(f^{M3})$ (step ST306). The determination section 2 compares thus captured response signal sequence $f^C(f^{M3})$ with the normal output value f, but because the defective module M1 is connected to the input/output section P1, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M3})$ captured in step ST306 with the response signal sequence $f^L(f^{M1})$ stored in the test response storage section 6. Because these are not the same, the determination section 2 determines that any of the modules M1 to M3 is defective. The test response storage section 6 stores therein the response signal sequence $f^C(f^{M3})$ derived in step ST306 as "$f^R$" (step ST310).

The control section 3 then makes a setting of "R=C=3" (step ST311). The determination section 2 then makes a determination whether there are four modules in the range for search (L to R) (step ST312). Because there are not four modules, the control section 3 calculates "Int((L+R)/2)" (step ST318). Based on the calculation result, the control section 3 makes a setting of "C=2", and disconnects the module M2 from all of the input/output sections. In this state, the signal generation section 4 inputs a test pattern x to the semiconductor integrated circuit 1, and the determination section 2 captures the resulting response signal sequence $f^C(f^{M2})$ (step ST306). The determination section 2 compares thus captured response signal sequence $f^C(f^{M2})$ with the normal output value f, but because the defective module M1 is connected to the input/output section P1, the captured response signal sequence is not the same as the normal output value (step ST307).

The determination section 2 makes a determination whether there are four or more modules in the range for search (L to R) (step ST308). Because there are three modules, the procedure goes to step ST319. In step ST319, the determination section 2 determines that the response signal sequences $f^C(f^{M2})$ and $f^L(f^{M1})$ are not the same, and in step ST320, determines that the response signal sequences $f^C(f^{M2})$ and $f^R(f^{M3})$ are the same. In this manner, the determination section 2 identifies the module M1 as being a defective module needing correction.

Figure 15:
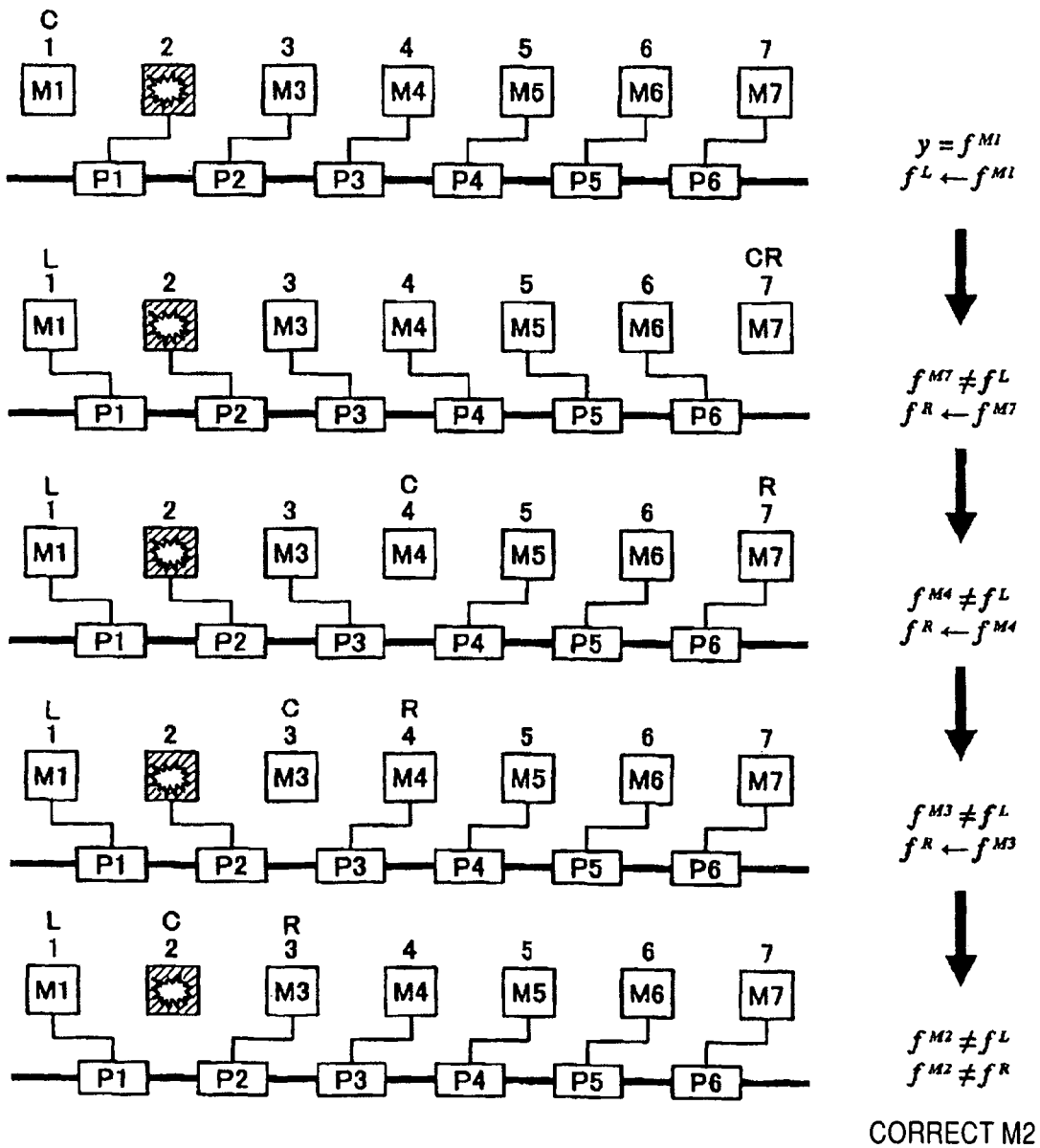
FIG. 15 is a second diagram illustrating another specific example of the defective module search process if with a defective module.

2. Case when Module M2 is Defective (FIG. 15)

The control section 3 first makes a setting of "C=1" (step ST301), and disconnects the module M1 from all of the input/output sections. In this state, the signal generation section 4 inputs a test pattern x to the semiconductor integrated circuit 1, and the determination section 2 captures the resulting response signal sequence $f^C(f^{M1})$ (step ST302). The determination section 2 compares thus captured response signal sequence $f^C$ with the normal output value f stored in the normal output value storage section 5. Because the defective module M2 is connected to the input/output section P1, the captured response signal sequence is determined as not being the same as the normal output value (step ST303). The test response storage section 6 stores therein the response signal sequence $f^C(f^{M1})$ derived in step ST302 as "$f^L$" (step ST304).

The control section 3 then makes settings of "L=1", and "C=R=7", and disconnects the module M7 from all of the input/output sections (step ST305). In this state, the signal generation section 4 inputs a test pattern x to the semiconductor integrated circuit 1, and the determination section 2 captures the resulting response signal sequence $f^C(f^{M7})$ (step ST306). The determination section 2 compares thus captured response signal sequence $f^C(f^{M7})$ with the normal output value f, but because the defective module M2 is connected to the input/output section P2, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M7})$ captured in step ST306 with the response signal sequence $f^L(f^{M1})$ stored in the test response storage section 6. Because these are not the same, the determination section 2 determines that any of the modules M1 to M7 is defective. The test response storage section 6 stores therein the response signal sequence $f^C(f^{M7})$ derived in step ST306 as "$f^R$" (step ST310).

The control section 3 then makes a setting of "R=C=7" (step ST311). The determination section 2 then makes a determination whether there are four modules in the range for search (L to R) (step ST312). Because there are not four modules, the procedure goes to step ST318. In step ST318, the control section 3 calculates "Int((L+R)/2)". Based on the calculation result, the control section 3 makes a setting of "C=4", and disconnects the module M4 from all of the input/output sections. In this state, the signal generation section 4 inputs a test pattern x to the semiconductor integrated circuit 1, and the determination section 2 captures the resulting response signal sequence $f^C(f^{M4})$ (step ST306). The determination section 2 compares thus captured response signal sequence $f^C(f^{M4})$ with the normal output value f, but because the defective module M2 is connected to the input/output section P2, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M4})$ captured in step ST306 with the response signal sequence $f^L(f^{M1})$ stored in the test response storage section 6. Because these are not the same, the determination section 2 determines that any of the modules M1 to M4 is defective. The test response storage section 6 stores therein the response signal sequence $f^C(f^{M4})$ derived in step ST306 as "$f^R$" (step ST310).

The control section 3 then makes a setting of "R=C=4" (step ST311). The determination section 2 then makes a determination whether there are four modules in the range for search (L to R) (step ST312). Because there are four modules, the procedure goes to step ST313. In step ST313, the control section 3 makes a setting of "C=R−1=3", and disconnects the module M3 from all of the input/output sections. In this state, the signal generation section 4 inputs a test pattern x to the semiconductor integrated circuit 1, and the determination section 2 captures the resulting response signal sequence $f^C(f^{M3})$ (step ST306). The determination section 2 compares thus captured response signal sequence $f^C(f^{M3})$ with the normal output value f, but because the defective module M2 is connected to the input/output section P2, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M3})$ captured in step ST306 with the response signal sequence $f^L(f^{M1})$ stored in the test response storage section 6. Because these are not the same, the determination section 2 determines that any of the modules M1 to M3 is defective. The test response storage section 6 stores therein the response signal sequence $f^C(f^{M3})$ derived in step ST306 as "$f^R$" (step ST310).

The control section 3 then makes a setting of "R=C=3" (step ST311). The determination section 2 then makes a determination whether there are four modules in the range for search (L to R) (step ST312). Because there are not four modules, the control section 3 calculates "Int((L+R)/2)" (step ST318). Based on the calculation result, the control section 3 makes a setting of "C=2", and disconnects the module M2 from all of the input/output sections. In this state, the signal generation section 4 inputs a test pattern x to the semiconductor integrated circuit 1, and the determination section 2 captures the resulting response signal sequence $f^C(f^{M2})$ (step ST306). The determination section 2 compares thus captured response signal sequence $f^C(f^{M2})$ with the normal output value f. When these are the same, the module M2 is determined as being a defective target, and this is the end of the defective module search process (step ST307).

Assumed here is that any of the other module blocks includes a defective module. In this case, the response signal sequence $f^C(f^{M2})$ is not the same as the normal output value f, and the defective module search process is thus continued.

The determination section 2 makes a determination whether there are four or more modules in the range for search (L to R) (step ST308). Because there are three modules, the procedure goes to step ST319. In step ST319, the determination section 2 determines that the response signal sequences $f^C(f^{M2})$ and $f^L(f^{M1})$ are not the same, and determines in step ST320 that the response signal sequences $f^C(f^{M2})$ and $f^R(f^{M3})$ are not the same. In this manner, the determination section 2 identifies the module M2 as being a defective module needing correction.

Figure 16:
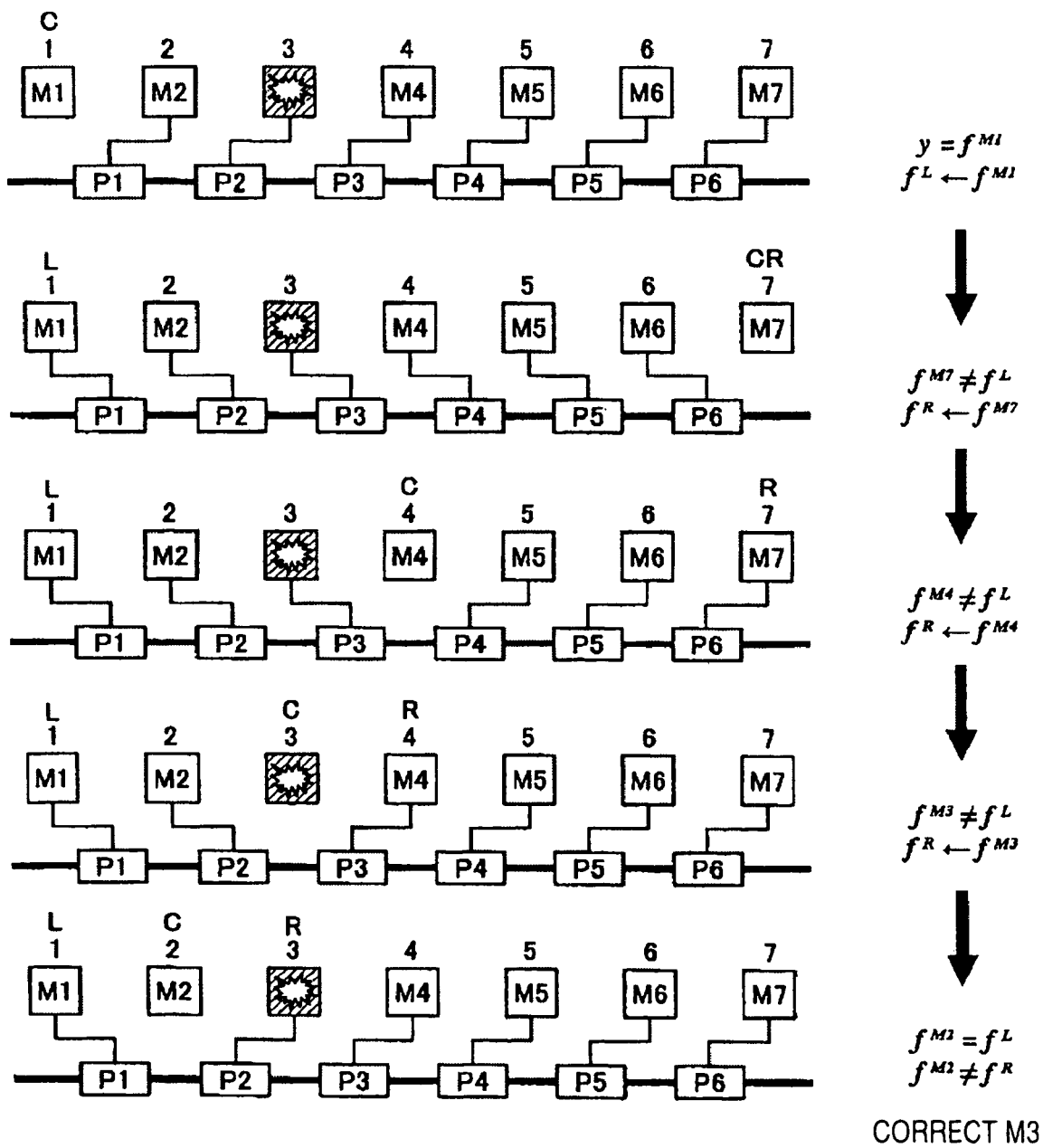
FIG. 16 is a third diagram illustrating still another specific example of the defective module search process if with a defective module.

3. Case when Module M3 is Defective (FIG. 16)

The control section 3 first makes a setting of "C=1" (step ST301), and disconnects the module M1 from all of the input/output sections. In this state, the signal generation section 4 inputs a test pattern x to the semiconductor integrated circuit 1, and the determination section 2 captures the resulting response signal sequence $f^C(f^{M1})$ (step ST302). The determination section 2 compares thus captured response signal sequence $f^C$ with the normal output value f stored in the normal output value storage section 5, but because the defective module M3 is connected to the input/output section P2, the captured response signal sequence is determined as not being the same as the normal output value (step ST303). The test response storage section 6 stores therein the response signal sequence $f^C(f^{M1})$ derived in step ST302 as "$f^L$" (step ST304).

The control section 3 then makes settings of "L=1", and "C=R=7", and disconnects the module M7 from all of the input/output sections (step ST305). In this state, the signal generation section 4 inputs a test pattern x to the semiconductor integrated circuit 1, and the determination section 2 captures the resulting response signal sequence $f^C(f^{M7})$ (step ST306). The determination section 2 compares thus captured response signal sequence $f^C(f^{M7})$ with the normal output value f, but because the defective module M3 is connected to the input/output section P3, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M7})$ captured in step ST306 with the response signal sequence $f^L(f^{M1})$ stored in the test response storage section 6. Because these are not the same, the determination section 2 determines that any of the modules M1 to M7 is defective. The test response storage section 6 stores therein the response signal sequence $f^C(f^{M7})$ derived in step ST306 as "$f^R$" (step ST310).

The control section 3 then makes a setting of "R=C=7" (step ST311). The determination section 2 then makes a determination whether there are four modules in the range for search (L to R) (step ST312). Because there are not four modules, the procedure goes to step ST318. In step ST318, the control section 3 calculates "Int(L+R)/2)". Based on the calculation result, the control section 3 makes a setting of "C=4", and disconnects the module M4 from all of the input/output sections. In this state, the signal generation section 4 inputs a test pattern x to the semiconductor integrated circuit 1, and the determination section 2 captures the resulting response signal sequence $f^C(f^{M4})$ (step ST306). The determination section 2 compares thus captured response signal sequence $f^C(f^{M4})$ with the normal output value f, but because the defective module M3 is connected to the input/output section P3, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M4})$ captured in step ST306 with the response signal sequence $f^L(f^{M1})$ stored in the test response storage section 6. Because these are not the same, the determination section 2 determines that any of the modules M1 to M4 is defective. The test response storage section 6 stores therein the response signal sequence $f^C(f^{M4})$ derived in step ST306 as "$f^R$" (step ST310).

The control section 3 then makes a setting of "R=C=4" (step ST311). The determination section 2 then makes a determination whether there are four modules in the range for search (L to R) (step ST312). Because there are four modules, the procedure goes to step ST313. In step ST313, the control section 3 makes a setting of "C=R-1=3", and disconnects the module M3 from all of the input/output sections. In this state, the signal generation section 4 inputs a test pattern x to the semiconductor integrated circuit 1, and the determination section 2 captures the resulting response signal sequence $f^C(f^{M3})$ (step ST306). The determination section 2 compares thus captured response signal sequence $f^C(f^{M3})$ with the normal output value f. When these are the same, the module M3 is determined as being a defective target, and this is the end of the defective module search process (step ST307).

Assumed here is that any of the other module blocks includes a defective module. In this case, the response signal sequence $f^C(f^{M3})$ is not the same as the normal output value f, and the defective module search process is thus continued.

The determination section 2 makes a determination whether there are four or more modules in the range for search (L to R) (step ST308). Because there are four or more modules, the procedure goes to step ST309. The determination section 2 then compares the response signal sequence $f^C(f^{M3})$ captured in step ST306 with the response signal sequence $f^L(f^{M1})$ stored in the test response storage section 6. Because these are not the same, the determination section 2 determines that any of the modules M1 to M3 is defective. The test response storage section 6 stores therein the response signal sequence $f^C(f^{M3})$ derived in step ST306 as "$f^R$" (step ST310).

The control section 3 then makes a setting of "R=C=3" (step ST311). The determination section 2 then makes a determination whether there are four modules in the range for search (L to R) (step ST312). Because there are not four modules, the control section 3 calculates "Int((L+R)/2)" (step ST318). Based on the calculation result, the control section 3 makes a setting of "C=2", and disconnects the module M2 from all of the input/output sections. In this state, the signal generation section 4 inputs a test pattern x to the semiconductor integrated circuit 1, and the determination section 2 captures the resulting response signal sequence $f^C(f^{M2})$ (step ST306). The determination section 2 compares thus captured response signal sequence $f^C(f^{M2})$ with the normal output value f, but because the defective module M3 is connected to the input/output section P2, the captured response signal sequence is determined as not being the same as the normal output value (step ST307).

The determination section 2 makes a determination whether there are four or more modules in the range for search (L to R) (step ST308). Because there are three modules, the procedure goes to step ST319. In step ST319, the determination section 2 determines that the response signal sequences $f^C(f^{M2})$ and $f^L(f^{M1})$ are the same, and in step ST321, determines that the response signal sequences $f^C(f^{M2})$ and $f^R(f^{M3})$ are not the same. In this manner, the determination section 2 identifies the module M3 as being a defective module needing correction.

Figure 17:
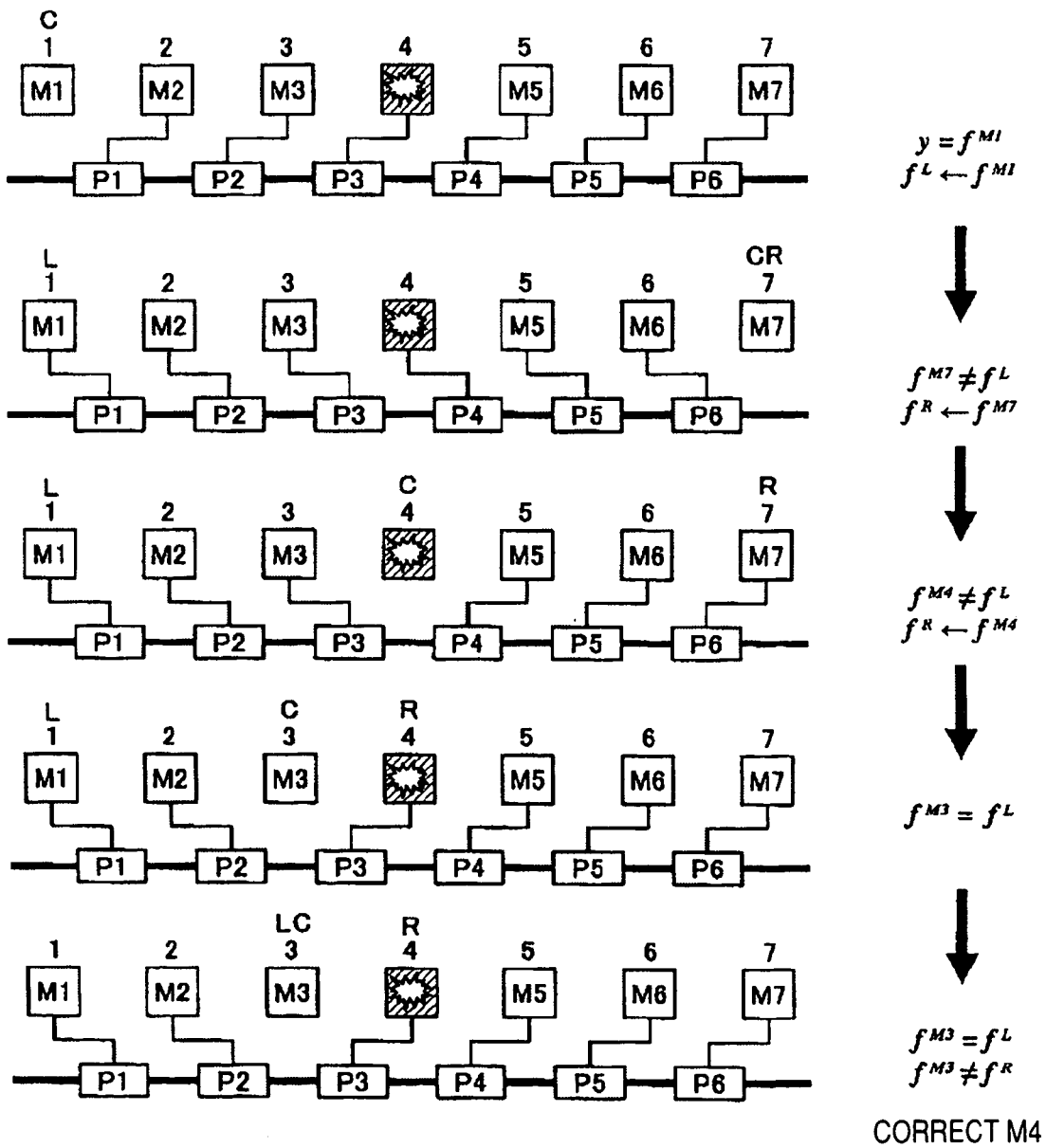
FIG. 17 is a fourth diagram illustrating still another specific example of the defective module search process if with a defective module.

4. Case when Module M4 is Defective (FIG. 17)

The control section 3 first makes a setting of "C=1" (step ST301), and disconnects the module M1 from all of the input/output sections. In this state, the signal generation section 4 inputs a test pattern x to the semiconductor integrated circuit 1, and the determination section 2 captures the resulting response signal sequence $f^C(f^{M1})$ (step ST302). The determination section 2 compares thus captured response signal sequence $f^C$ with the normal output value f stored in the normal output value storage section 5, but because the defective module M4 is connected to the input/output section P3, the captured response signal sequence is determined as not being the same as the normal output value (step ST303). The test response storage section 6 stores therein the response signal sequence $f^C(f^{M1})$ derived in step ST302 as "$f^L$" (step ST304).

The control section 3 then makes settings of "L=1", and "C=R=7", and disconnects the module M7 from all of the input/output sections (step ST305). In this state, the signal generation section 4 inputs a test pattern x to the semiconductor integrated circuit 1, and the determination section 2 captures the resulting response signal sequence $f^C(f^{M7})$ (step ST306). The determination section 2 compares thus captured response signal sequence $f^C(f^{M7})$ with the normal output value f, but because the defective module M4 is connected to the input/output section P4, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M7})$ captured in step ST306 with the response signal sequence $f^L(f^{M1})$ stored in the test response storage section 6. Because these are not the same, the determination section 2 determines that any of the modules M1 to M7 is defective. The test response storage section 6 stores therein the response signal sequence $f^C(f^{M7})$ derived in step ST306 as "$f^R$" (step ST310).

The control section 3 then makes a setting of "R=C=7" (step ST311). The determination section 2 then makes a determination whether there are four modules in the range for search (L to R) (step ST312). Because there are not four modules, the procedure goes to step ST318. In step ST318, the control section 3 calculates "Int(L+R)/2)". Based on the calculation result, the control section 3 makes a setting of "C=4", and disconnects the module M4 from all of the input/output sections. In this state, the signal generation section 4 inputs a test pattern x to the semiconductor integrated circuit 1, and the determination section 2 captures the resulting response signal sequence $f^C(f^{M4})$ (step ST306). The determination section 2 compares thus captured response signal sequence $f^C(f^{M4})$ with the normal output value f. When these are the same, the determination section 2 identifies the module M4 as being a correction target, and this is the end of the defective module correction process (step ST307).

Assumed here is that any of the other module blocks includes a defective module. In this case, the response signal sequence $f^C(f^{M4})$ is not the same as the normal output value f, and the defective module search process is thus continued.

The determination section 2 makes a determination whether there are four or more modules in the range for search (L to R) (step ST308). Because there are four or more modules, the procedure goes to step ST309. The determination section 2 then compares the response signal sequence $f^C(f^{M4})$ captured in step ST306 with the response signal sequence $f^L(f^{M1})$ stored in the test response storage section 6. Because these are not the same, the determination section 2 determines that any of the modules M1 to M4 is defective. The test response storage section 6 stores therein the response signal sequence $f^C(f^{M4})$ derived in step ST306 as "$f^R$" (step ST310).

The control section 3 then makes a setting of "L=C=4" (step ST311). The determination section 2 then makes a determination whether there are four modules in the range for search (L to R) (step ST312). Because there are four modules, the procedure goes to step ST313. In step ST313, the control section 3 makes a setting of "C=R−1=3", and disconnects the module M3 from all of the input/output sections. In this state, the signal generation section 4 inputs a test pattern x to the semiconductor integrated circuit 1, and the determination section 2 captures the resulting response signal sequence $f^C(f^{M3})$ (step ST306). The determination section 2 compares thus captured response signal sequence $f^C(f^{M3})$ with the normal output value f, but because the defective module M4 is connected to the input/output section P3, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M3})$ captured in step ST306 with the response signal sequence $f^L(f^{M1})$ stored in the test response storage section 6. Because these are the same, the determination section 2 determines that none of the modules M1 to M3 is defective. In this case, the determination section 2 determines whether "C=R" is established or not (step ST314). This is not established so that the procedure goes to step ST315.

In step ST315, the control section 3 then makes a setting of "L=C=3". The determination section 2 then makes a determination whether there are four modules in the range for search (L to R) (step ST316). Because there are not four modules, the control section 3 calculates "Int(L+R)/2)" (step ST318). Based on the calculation result, the control section 3 makes a setting of "C=3", and disconnects the module M3 from all of the input/output sections. In this state, the signal generation section 4 inputs a test pattern x to the semiconductor integrated circuit 1, and the determination section 2 captures the resulting response signal sequence $f^C(f^{M3})$ (step ST306). The determination section 2 compares thus captured response signal sequence $f^C(f^{M3})$ with the normal output value f, but because the defective module M4 is connected to the input/output section P3, the captured response signal sequence is determined as not being the same as the normal output value (step ST307).

The determination section 2 makes a determination whether there are four or more modules in the range for search (L to R) (step ST308). Because there are two modules, the procedure goes to step ST319.

The determination section 2 then determines in step ST319 that the response signal sequences $f^C(f^{M3})$ and $f^L(f^{M1})$ are the same, and determines in step ST321 that the response signal sequences $f^C(f^{M3})$ and $f^R(f^{M4})$ are not the same.

In this case, because none of the modules M1 to M3 is determined as including a defective module in step ST309, "$f^L=f^{M2}=f^{M3}$" is established.

This leads to an assumption that the determination section 2 determines in steps ST319 and ST321 as "$f^{M2}=f^{M3}$", and "$f^{M3} \neq f^{M4}$". Accordingly, based on the relationship of FIG. 11, the determination section 2 identifies the module M4 as being a defective module needing correction.

Figure 18:
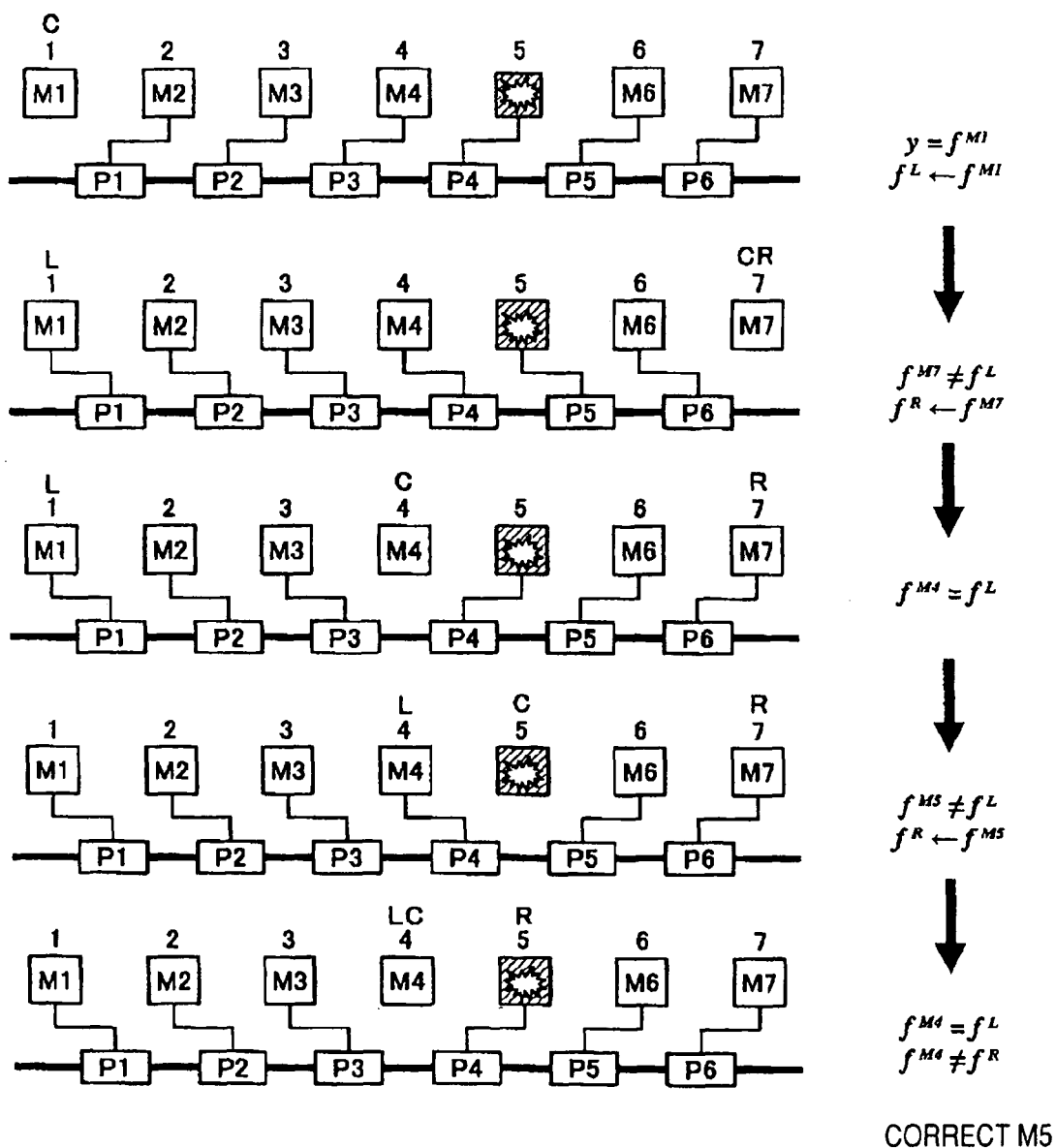
FIG. 18 is a fifth diagram illustrating still another specific example of the defective module search process if with a defective module.

5. Case when Module M5 is Defective (FIG. 18)

The control section 3 first makes a setting of "C=1" (step ST301), and disconnects the module M1 from all of the input/output sections. In this state, the signal generation section 4 inputs a test pattern x to the semiconductor integrated circuit 1, and the determination section 2 captures the resulting response signal sequence $f^C(f^{M1})$ (step ST302). The determination section 2 compares thus captured response signal sequence $f^C$ with the normal output value f stored in the normal output value storage section 5, but because the defective module M5 is connected to the input/output section P4, the captured response signal sequence is determined as not being the same as the normal output value (step ST303). The test response storage section 6 stores therein the response signal sequence $f^C(f^{M1})$ derived in step ST302 as "$f^L$" (step ST304).

The control section 3 then makes settings of "L=1", and "C=R=7", and disconnects the module M7 from all of the input/output sections (step ST305). In this state, the signal generation section 4 inputs a test pattern x to the semiconductor integrated circuit 1, and the determination section 2 captures the resulting response signal sequence $f^C(f^{M7})$ (step ST306). The determination section 2 compares thus captured response signal sequence $f^C(f^{M7})$ with the normal output value f, but because the defective module M5 is connected to the input/output section P5, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M7})$ captured in step ST306 with the response signal sequence $f^L(f^{M1})$ stored in the test response storage section 6. Because these are not the same, the determination section 2 determines that any of the modules M1 to M7 is defective. The test response storage section 6 stores therein the response signal sequence $f^C(f^{M7})$ derived in step ST306 as "$f^R$" (step ST310).

The control section 3 then makes a setting of "R=C=7" (step ST311). The determination section 2 then makes a determination whether there are four modules in the range for search (L to R) (step ST312). Because there are not four modules, the procedure goes to step ST318. In step ST318, the control section 3 calculates "Int(L+R)/2)". Based on the calculation result, the control section 3 makes a setting of "C=4", and disconnects the module M4 from all of the input/output sections. In this state, the signal generation section 4 inputs a test pattern x to the semiconductor integrated circuit 1, and the determination section 2 captures the resulting response signal sequence $f^C(f^{M4})$ (step ST306). The determination section 2 compares thus captured response signal sequence $f^C(f^{M4})$ with the normal output value f, but because the defective module M5 is connected to the input/output section P4, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M4})$ captured in step ST306 with the response signal sequence $f^L(f^{M1})$ stored in the test response storage section 6. Because these are the same, the determination section 2 determines that none of the modules M1 to M4 is defective. In this case, the determination section 2 determines whether "C=R" is established or not (step ST314). This is not established so that the procedure goes to step ST315.

In step ST315, the control section 3 then makes a setting of "L=C=4" (step ST311). The determination section 2 then makes a determination whether there are four modules in the range for search (L to R) (step ST312). Because there are four modules, the control section 3 makes a setting of "C=L+1=5", and disconnects the module M5 from all of the input/output sections. In this state, the signal generation section 4 inputs a test pattern x to the semiconductor integrated circuit 1, and the determination section 2 captures the resulting response signal sequence $f^C(f^{M5})$ (step ST306). The determination section 2 compares thus captured response signal sequence $f^C(f^{M5})$ with the normal output value f. When these are the same, the module M5 is determined as being a defective target, and this is the end of the defective module search process (step ST307).

Assumed here is that any of the other module blocks includes a defective module. In this case, the response signal sequence $f^C(f^{M5})$ is not the same as the normal output value f, and the defective module search process is thus continued.

The determination section 2 makes a determination whether there are four or more modules in the range for search (L to R) (step ST308). Because there are four or more modules, the procedure goes to step ST309. The determination section 2 then compares the response signal sequence $f^C(f^{M5})$ captured in step ST306 with the response signal sequence $f^L(f^{M4})$ stored in the test response storage section 6. Because these are not the same, the determination section 2 determines that either of the modules M4 or M5 is defective. The test response storage section 6 stores therein the response signal sequence $f^C(f^{M5})$ derived in step ST306 as "$f^R$" (step ST310).

The control section 3 then makes a setting of "R=C=5" (step ST311). The determination section 2 then makes a determination whether there are four modules in the range for search (L to R) (step ST312). Because there are not four modules, the control section 3 calculates "Int((L+R)/2)" (step ST318). Based on the calculation result, the control section 3 makes a setting of "C=4", and disconnects the module M4 from all of the input/output sections. In this state, the signal generation section 4 inputs a test pattern x to the semiconductor integrated circuit 1, and the determination section 2 captures the resulting response signal sequence $f^C(f^{M4})$ (step ST306). The determination section 2 compares thus captured response signal sequence $f^C(f^{M4})$ with the normal output value f, but because the defective module M5 is connected to the input/output section P4, the captured response signal sequence is determined as not being the same as the normal output value (step ST307).

The determination section 2 makes a determination whether there are four or more modules in the range for search (L to R) (step ST308). Because there are two modules, the procedure goes to step ST319.

In step ST319, the determination section 2 determines in step ST319 that the response signal sequences $f^C(f^{M4})$ and $f^L(f^{M4})$ are the same, and determines in step ST321 that the response signal sequences $f^C(f^{M4})$ and $f^R(f^{M5})$ are not the same.

In this case, because none of the modules M1 to M4 is determined as including a defective module in step ST309, "$f^L=f^{M3}=f^{M4}$" is established.

This leads to an assumption that the determination section 2 determines in steps ST319 and ST321 as "$f^{M3}=f^{M4}$", and "$f^{M4} \neq f^{M5}$". Accordingly, based on the relationship of FIG. 11, the determination section 2 identifies the module M5 as being a defective module needing correction.

6. Case when Module M6 is Defective (FIG. 19)

The control section 3 first makes a setting of "C=1" (step ST301), and disconnects the module M1 from all of the input/output sections. In this state, the signal generation section 4 inputs a test pattern x to the semiconductor integrated circuit 1, and the determination section 2 captures the resulting response signal sequence $f^C(f^{M1})$ (step ST302). The determination section 2 compares thus captured response signal sequence $f^C$ with the normal output value f stored in the normal output value storage section 5, but because the defective module M6 is connected to the input/output section P5, the captured response signal sequence is determined as not being the same as the normal output value (step ST303). The test response storage section 6 stores therein the response signal sequence $f^C(f^{M1})$ derived in step ST302 as "$f^L$" (step ST304).

The control section 3 then makes settings of "L=1", and "C=R=7", and disconnects the module M7 from all of the input/output sections (step ST305). In this state, the signal generation section 4 inputs a test pattern x to the semiconductor integrated circuit 1, and the determination section 2 captures the resulting response signal sequence $f^C(f^{M7})$ (step ST306). The determination section 2 compares thus captured response signal sequence $f^C(f^{M7})$ with the normal output value f, but because the defective module M6 is connected to the input/output section P6, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M7})$ captured in step ST306 with the response signal sequence $f^L(f^{M1})$ stored in the test response storage section 6. Because these are not the same, the determination section 2 determines that any of the modules M1 to M7 is defective. The test response storage section 6 stores therein the response signal sequence $f^C(f^{M7})$ derived in step ST306 as "$f^R$" (step ST310).

The control section 3 then makes a setting of "R=C=7" (step ST311). The determination section 2 then makes a determination whether there are four modules in the range for search (L to R) (step ST312). Because there are not four modules, the procedure goes to step ST318. In step ST318, the control section 3 calculates "Int(L+R)/2)". Based on the calculation result, the control section 3 makes a setting of "C=4", and disconnects the module M4 from all of the input/output sections. In this state, the signal generation section 4 inputs a test pattern x to the semiconductor integrated circuit 1, and the determination section 2 captures the resulting response signal sequence $f^C(f^{M4})$ (step ST306). The determination section 2 compares thus captured response signal sequence $f^C(f^{M4})$ with the normal output value f, but because the defective module M6 is connected to the input/output section P5, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M4})$ captured in step ST306 with the response signal sequence $f^L(f^{M1})$ stored in the test response storage section 6. Because these are the same, the determination section 2 determines that none of the modules M1 to M4 includes a defective module. In this case, the determination section 2 determines whether "C=R" is established or not (step ST314). This is not established so that the procedure goes to step ST315.

In step ST315, the control section 3 then makes a setting of "L=C=4" (step ST311). The determination section 2 then makes a determination whether there are four modules in the range for search (L to R) (step ST312). Because there are four modules, the control section 3 makes a setting of "C=L+1=5", and disconnects the module M5 from all of the input/output sections. In this state, the signal generation section 4 inputs a test pattern x to the semiconductor integrated circuit 1, and the determination section 2 captures the resulting response signal sequence $f^C(f^{M5})$ (step ST306). The determination section 2 compares thus captured response signal sequence $f^C(f^{M5})$ with the normal output value f, but because the defective module M6 is connected to the input/output section P5, the captured response signal sequence is determined as not being the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M5})$ captured in step ST306 with the response signal sequence $f^L(f^{M4})$ stored in the test response storage section 6. Because these are the same, the determination section 2 determines that neither of the modules M4 and M5 is defective. In this case, the determination section 2 determines whether "C=R" is established or not (step ST314). This is not established so that the procedure goes to step ST315.

In step ST315, the control section 3 then makes a setting of "L=C=5". The determination section 2 then makes a determination whether there are four modules in the range for search (L to R) (step ST312). Because there are not four modules, the control section 3 calculates "Int((L+R)/2)" (step ST318). Based on the calculation result, the control section 3 makes a setting of "C=6", and disconnects the module M6 from all of the input/output sections. In this state, the signal generation section 4 inputs a test pattern x to the semiconductor integrated circuit 1, and the determination section 2 captures the resulting response signal sequence $f^C(f^{M6})$ (step ST306). The determination section 2 compares thus captured response signal sequence $f^C(f^{M6})$ with the normal output value f. When these are the same, the module M6 is determined as being a correction target, and this is the end of the defective module search process (step ST307).

Assumed here is that any of the other module blocks includes a defective module. In this case, the response signal sequence $f^C(f^{M6})$ is not the same as the normal output value f, and the defective module search process is thus continued.

The determination section 2 makes a determination whether there are four or more modules in the range for search (L to R) (step ST308). Because there are three modules, the procedure goes to step ST319. In step ST319, the determination section 2 determines that the response signal sequences $f^C(f^{M6})$ and $f^C(f^{M5})$ are not the same, and in step ST320, determines that the response signal sequences $f^C(f^{M6})$ and $f^R(f^{M7})$ are not the same. In this manner, the determination section 2 identifies the module M6 as being a defective module needing correction.

7. Case when Module M7 is Defective (FIG. 20)

The control section 3 first makes a setting of "C=1" (step ST301), and disconnects the module M1 from all of the input/output sections. In this state, the signal generation section 4 inputs a test pattern x to the semiconductor integrated circuit 1, and the determination section 2 captures the resulting response signal sequence $f^C(f^{M1})$ (step ST302). The determination section 2 compares thus captured response signal sequence $f^C$ with the normal output value f stored in the normal output value storage section 5, but because the defective module M7 is connected to the input/output section P6, the captured response signal sequence is determined as not being the same as the normal output value (step ST303). The test response storage section 6 stores therein the response signal sequence $f^C(f^{M1})$ derived in step ST302 as "$f^L$" (step ST304).

The control section 3 then makes settings of "L=1", and "C=R=7", and disconnects the module M7 from all of the input/output sections (step ST305). In this state, the signal generation section 4 inputs a test pattern x to the semiconductor integrated circuit 1, and the determination section 2 captures the resulting response signal sequence $f^C(f^{M7})$ (step ST306). The determination section 2 compares thus captured response signal sequence $f^C(f^{M7})$ with the normal output value f. When these are the same, the module M7 is determined as being a correction target, and this is the end of the defective module search process (step ST307).

Assumed here is that any of the other module blocks includes a defective module. In this case, the response signal sequence $f^C(f^{M7})$ is not the same as the normal output value f, and the defective module search process is thus continued.

The determination section 2 makes a determination whether there are four or more modules in the range for search (L to R) (step ST308). Because there are four or more modules, the procedure goes to step ST309. The determination section 2 then compares the response signal sequence $f^C(f^{M7})$ captured in step ST306 with the response signal sequence $f^L(f^{M1})$ stored in the test response storage section 6. Because these are not the same, the determination section 2 determines that any of the modules M1 to M7 is defective. The test response storage section 6 stores therein the response signal sequence $f^C(f^{M7})$ derived in step ST306 as "$f^R$" (step ST310).

The control section 3 then makes a setting of "R=C=7" (step ST311). The determination section 2 then makes a determination whether there are four modules in the range for search (L to R) (step ST312). Because there are not four modules, the procedure goes to step ST318. In step ST318, the control section 3 calculates "Int(L+R)/2)". Based on the calculation result, the control section 3 makes a setting of "C=4", and disconnects the module M4 from all of the input/output sections. In this state, the signal generation section 4 inputs a test pattern x to the semiconductor integrated circuit 1, and the determination section 2 captures the resulting response signal sequence $f^C(f^{M4})$ (step ST306). The determination section 2 compares thus captured response signal sequence $f^C(f^{M4})$ with the normal output value f, but because the defective module M7 is connected to the input/output section P6, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M4})$ captured in step ST306 with the response signal sequence $f^L(f^{M1})$ stored in the test response storage section 6. Because these are the same, the determination section 2 determines that none of the modules M1 to M4 is defective. In this case, the determination section 2 determines whether "C=R" is established or not (step ST314). This is not established so that the procedure goes to step ST315.

In step ST315, the control section 3 then makes a setting of "L=C=4". The determination section 2 then makes a determination whether there are four modules in the range for search (L to R) (step ST316). Because there are four modules, the control section 3 makes a setting of "C=L+1=5", and disconnects the module M5 from all of the input/output sections. In this state, the signal generation section 4 inputs a test pattern x to the semiconductor integrated circuit 1, and the determination section 2 captures the resulting response signal sequence $f^C(f^{M5})$ (step ST306). The determination section 2 compares thus captured response signal sequence $f^C(f^{M5})$ with the normal output value f, but because the defective module M7 is connected to the input/output section P6, the captured response signal sequence is determined as not being the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M5})$ captured in step ST306 with the response signal sequence $f^L(f^{M4})$ stored in the test response storage section 6. Because these are the same, the determination section 2 determines that neither of the modules M4 and M5 is defective. In this case, the determination section 2 determines whether "C=R" is established or not (step ST314). This is not established so that the procedure goes to step ST315.

In step ST315, the control section 3 then makes a setting of "L=C=5". The determination section 2 then makes a determination whether there are four modules in the range for search (L to R) (step ST312). Because there are not four modules, the control section 3 calculates "Int((L+R)/2)" (step ST318). Based on the calculation result, the control section 3 makes a setting of "C=6", and disconnects the module M6 from all of the input/output sections. In this state, the signal generation section 4 inputs a test pattern x to the semiconductor integrated circuit 1, and the determination section 2 captures the resulting response signal sequence $f^C(f^{M6})$ (step ST306). The determination section 2 compares thus captured response signal sequence $f^C(f^{M6})$ with the normal output value f, but because the defective module M7 is connected to the input/output section P6, the captured response signal sequence is determined as not being the same as the normal output value (step ST307).

The determination section 2 makes a determination whether there are four or more modules in the range for search (L to R) (step ST308). Because there are three modules, the procedure goes to step ST319. In step ST319, the determination section 2 determines that the response signal sequences $f^C(f^{M6})$ and $f^L(f^{M5})$ are the same, and in step ST321, determines that the response signal sequences $f^C(f^{M6})$ and $f^R(f^{M7})$ are not the same. In this manner, the determination section 2 identifies the module M7 as being a defective module needing correction.

8. Case when Deficiency is Found not in Module (FIG. 21)

The control section 3 first makes a setting of "C=1" (step ST301), and disconnects the module M1 from all of the input/output sections. In this state, the signal generation section 4 inputs a test pattern x to the semiconductor integrated circuit 1, and the determination section 2 captures the resulting response signal sequence $f^C(f^{M1})$ (step ST302). The determination section 2 compares thus captured response signal sequence $f^C$ with the normal output value f stored in the normal output value storage section 5, but because there is a deficiency not in the modules, the captured response signal sequence is determined as not being the same as the normal output value (step ST303). The test response storage section 6 stores therein the response signal sequence $f^C(f^{M1})$ derived in step ST302 as "$f^L$" (step ST304).

The control section 3 then makes settings of "L=1", and "C=R=7", and disconnects the module M7 from all of the input/output sections (step ST305). In this state, the signal generation section 4 inputs a test pattern x to the semiconductor integrated circuit 1, and the determination section 2 captures the resulting response signal sequence $f^C(f^{M7})$ (step ST306). The determination section 2 compares thus captured response signal sequence $f^C(f^{M7})$ with the normal output value f. Because there is a deficiency not in the modules, the captured response signal sequence is not the same as the normal output value (step ST307).

The determination section 2 makes a determination whether there are four or more modules in the range for search (L to R) (step ST308). Because there are four or more modules, the procedure goes to step ST309. The determination section 2 then compares the response signal sequence $f^C(f^{M7})$ captured in step ST306 with the response signal sequence $f^L(f^{M1})$ stored in the test response storage section 6. In this case, because there is a deficiency not in the modules, the response signal sequences $f^C(f^{M7})$ and $f^L(f^{M1})$ are the same. The determination section 2 thus makes a determination whether "C=R" is established (step ST314). This is established, and thus it is determined that no deficiency correction is possible because the connection among the module blocks is changed.

That is, when the semiconductor integrated circuit 1 outputs no normal response even after a function change is made for every module, it is determined that the deficiency is resulted from any other portions, i.e., portions except the module blocks through with the defective module search process.

This is the end of the description about the module test process in the test device of FIG. 1.

Described next is the manufacturing method of the semiconductor integrated circuit 1 being a test object in the above-described test device.

Figure 22:
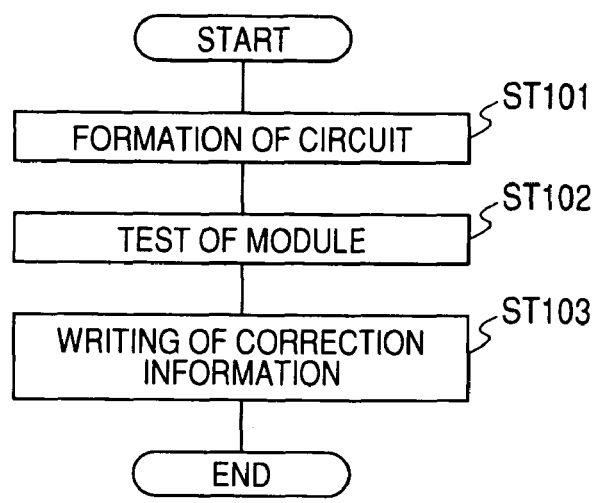
FIG. 22 is a diagram showing an exemplary semiconductor integrated circuit manufacturing method in the embodiment.

FIG. 22 is a diagram showing an exemplary semiconductor integrated circuit manufacturing method of the embodiment.

Step ST101

A semiconductor substrate is formed thereon with a deficiency-correctable circuit having such a configuration as shown in FIGS. 4, 6, and 7, for example.

Step ST102:

Modules included in the circuit formed in step ST101 is subjected to a test using the test method of FIGS. 12 and 13, for example, and any defective module is identified.

Step ST103:

Based on the test result of step ST102, a defective module is identified to be disconnected from all of the input/output sections, and information about such module identification is written to the storage section 70 (FIG. 6). When the storage section 70 is configured by a fuse, for example, a process of cutting the fuse is executed. With the process, the function assigned to the defective module is newly assigned to a normal module so that the deficiency correction is implemented.

As described in the foregoing, according to the embodiment, the semiconductor integrated circuit is controlled, without changing a function to be assigned to the whole of the modules in the semiconductor integrated circuit, to make the function change for assignment to each of the modules at least in a group of the modules. A detection is then made whether the semiconductor integrated circuit operates differently when the function change is made for assignment to the modules, and based on a detection result, a determination is made whether at least the group of the modules includes a defective module.

This favorably eliminates the need to provide the semiconductor integrated circuit with pads for test use or any additional circuit for specific use so that the semiconductor integrated circuit can be favorably reduced in size. The smaller-sized semiconductor chip will increase the productivity so that the manufacturing cost can be reduced. What is more, the possibility of deficiency is also reduced so that the yield can be increased. Further, the number of circuit elements is reduced compared with a case of including the pads for test use and the additional circuit for specific use, and the entire wire length is reduced in the circuit so that the power consumption can be accordingly saved.

The previous method of individually testing the modules requires forming a test pattern for every module. On the other hand, the method of the embodiment uses a general test pattern for testing the entire function of the semiconductor integrated circuit so that the time and efforts for the design operation relating to the test can be saved.

What is more, the previous method of individually testing the modules is not able to correct deficiencies if a circuit for separation use in the semiconductor integrated circuit becomes defective. This thus results in a reduction in yield, but the method of the embodiment is free from such a problem.

Moreover, according to the embodiment, the semiconductor integrated circuit is controlled that, without changing the function to be assigned to the whole of the modules included in the semiconductor integrated circuit 1, to make the function change for assignment to each of the modules at least in a part of the group of the modules determined by the determination section as including the defective module. Based on whether the semiconductor integrated circuit operates differently when the function change is made for assignment to the modules, a determination is made whether the defective module is included in the part of the group of the modules or in the remaining part of the group of the modules.

With such a configuration, compared with the previous method of individually testing the modules in a sequential manner, the procedure of identifying a defective module can be simplified to a considerable degree. By repeating the operation of segmenting the search range with a method similar to binary search, for example, a defective module can be identified with a considerable efficiency.

What is more, according to the embodiment, when the group of the modules determined as including the defective module carries three of the modules, a determination is made whether the semiconductor integrated circuit operates differently when the function change is made between two of the modules in the group of the modules, and whether the semiconductor integrated circuit operates differently when the function change is made between the remaining one of the modules in the group of the modules and either of the two modules. Based on the detection result, the defective module is identified.

With such a configuration, even with a semiconductor integrated circuit including a plurality of module blocks in which deficiencies are correctable using a redundant module, it is possible to identify a defective module in the module block with ease.

Although one embodiment of the invention is described above in detail, the invention is not surely restrictive thereto, and includes possible many variations.

Because the semiconductor integrated circuits are increasing in size to a further degree, there may be a possibility that response signal sequences to be output will be huge in data amount. In consideration thereof, the test device of the invention may be further provided with means for compressing response signal sequences to be output from the semiconductor integrated circuit being a test object.

Figure 23:
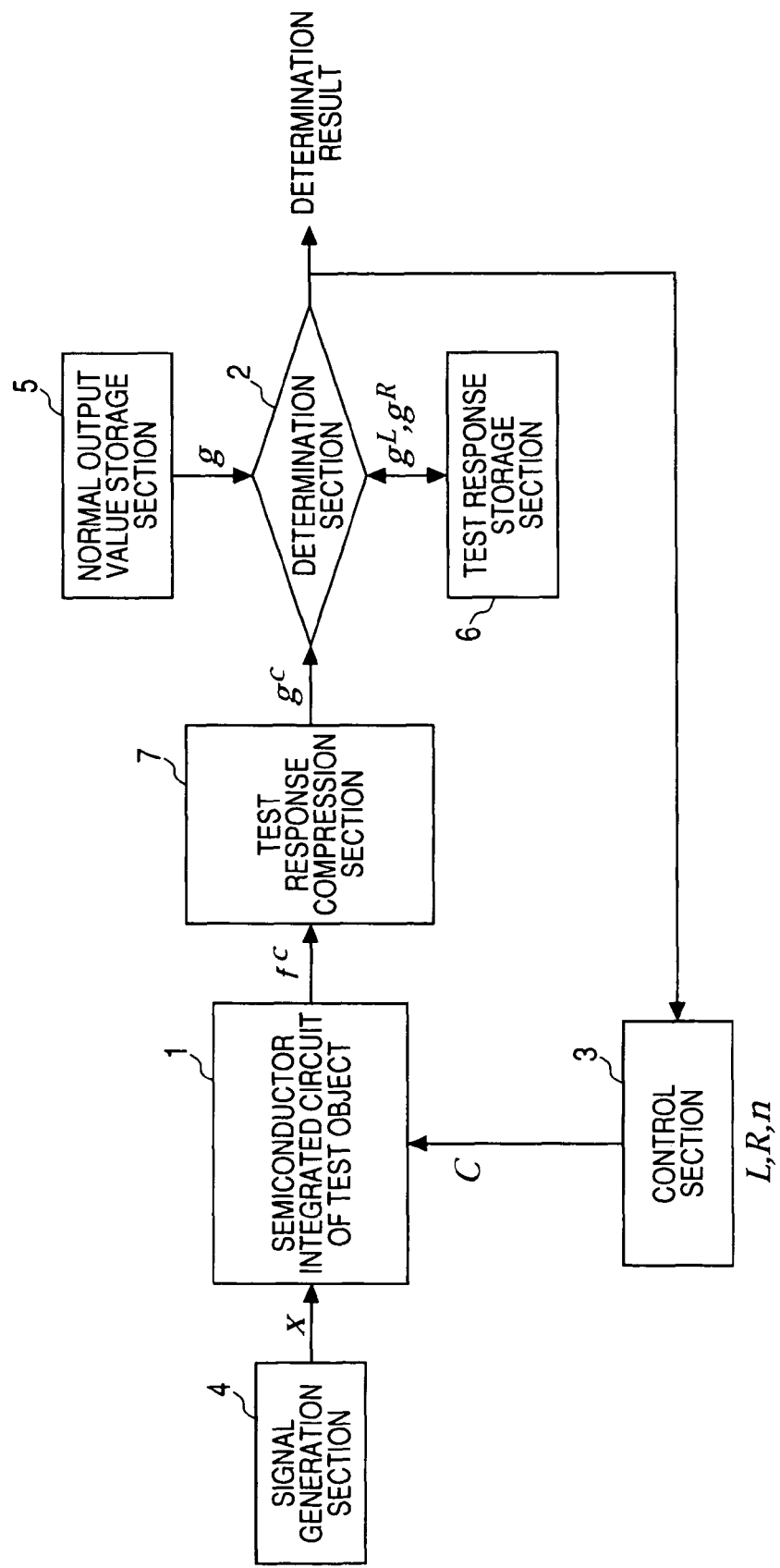
FIG. 23 is a diagram showing an exemplary configuration of a test device provided with means for compressing a response signal sequence.

FIG. 23 is a diagram showing an exemplary configuration of a test device provided with the means for compressing response signal sequences. The test device of FIG. 23 is of the similar configuration to the test device of FIG. 1, and provided with a test response compression section 7 for compressing response signal sequences coming from the semiconductor integrated circuit.

The test response compression section 7 compresses a response signal sequence f coming from the semiconductor integrated circuit by digital signal compression means such as MISR (Multiple Input Signature Register). The compression result is forwarded to the determination section 2 as a response signal sequence $g^C$.

Based on any change observed in the compression result of the response signal sequence $g^C$, the determination section 2 detects whether the semiconductor integrated circuit operates differently or not.

With this being the case, the normal output value storage section 5 stores therein a normal output value g corresponding to the compression result of the response signal sequence $g^C$.

By compressing the response signal sequence for processing as such, the normal output value storage section 5 and the test response storage section 6 can be considerably reduced in storage capacity, for example.

With the above-described embodiment, exemplified is the case of making a function change for assignment to any of the modules with the configuration in which the connection state of a plurality of redundant modules is changed. The invention is not surely restrictive thereto, i.e., the method of changing the module function is arbitrary. For example, the function change may be made for any of the modules by changing the connection among the modules by the crossbar configuration. Alternatively, when the modules are each a programmable circuit, the function change may be made by changing the program. When a plurality of modules communicate with one another over any common bus, the function change may be made for the modules by changing information for use for identifying each of the modules on the bus.

With the above-described embodiment, a detection is made whether the semiconductor integrated circuit operates differently or not based on a response signal coming in response to an input signal. The invention is surely not restrictive thereto, and such a detection may be made based on any change observed in the output voltage, the amplitude of an output current, the waveform, or others. Alternatively, such detection may be made based on any change observed in the operation speed and temperature, or the power consumption.

The circuit device being a test object in the invention is not restrictive to the semiconductor integrated circuit, and the invention is surely applicable to a circuit device such as an SIP (System in Package) configured by a plurality of semiconductor chips, and any device of a larger size.

In the above-described embodiment, any specific numbers, e.g., number of modules, number of input/output sections, or number of module blocks) are no more than examples, and can be arbitrarily changed.

It should be understood by those skilled in the art that various modifications, combinations, sub-combinations and alterations may occur depending on design requirements and other factors insofar as they are within the scope of the appended claims or the equivalents thereof.

What is claimed is:

1. A circuit device manufacturing method, comprising the steps of:

forming, on a semiconductor substrate, a circuit including:
N (where N is an integer larger than 2) modules being substitutable in terms of function for one another;
a circuit block including (N−1) input/output sections that each output at least a signal to one of the N modules, and/or each receive at least a signal generated in one of the N modules;
a module selection section that selects (N−1) modules of the N modules in accordance with an incoming control signal, and establishes a one-to-one connection between the selected (N−1) modules and the (N−1) input/output sections in the circuit block;
a signal input section that receives a signal designating which of the modules is to be disconnected from the (N−1) input/output sections;
a storage-section that is capable of storing therein information about which of the modules is to be disconnected from the (N−1) input/output sections; and
a control section that generates, in a first operation mode, a control signal to disconnect the modules designated by the signal provided to the signal input section from the (N−1) input/output sections, and in a second operation mode, generates the control signal to disconnect the modules designated by the information written in the storage section from the (N−1) input/output sections;
subjecting the N modules to a deficiency test in the first operation mode; and
determining which of the N modules is to be disconnected from the (N−1) input/output sections based on a test result in a test step, and writing information in the storage section to designate the module, wherein
the test step includes:
a first step of generating the control signal to change a connection state among each of the modules at least in a group of the N modules and the (N−1) input/output sections;
a second step of detecting whether the circuit operates differently when the connection state is changed in the first step, and based on a detection result, determining whether or not at least the group of the modules includes a defective module;
a third step of generating the control signal to change the connection state among each of the modules in a part of the group of the modules determined in the second step as including the defective module and the input/output sections, wherein in the second step, a detection is made whether the circuit operates differently when the connection state is changed in the third step, and based on the detection result, a determination is made whether the defective module is included in the part of the group of the modules or in a remaining part of the group of the modules; and
a fourth step of detecting, when the group of the modules determined in the second step as including the defective module carries three of the modules, whether the circuit operates differently when the function change is made in the third step between two of the modules in the group of the modules, and whether the circuit operates differently when the function change is made in the third step between a remaining one of the modules in the group of the modules and either two of the modules, and based on the detection result, identifying the defective module.

2. A circuit device manufacturing method, comprising the steps of:

forming, on a semiconductor substrate, a circuit including:
N (where N is an integer larger than 2) modules being substitutable in terms of function for one another;
a circuit block including (N−1) input/output sections that each output at least a signal to one of the modules, and/or each receive at least a signal generated in one of the N modules;
a module selection section that selects (N−1) modules of the N modules in accordance with an incoming control signal, and establishes a one-to-one connection between the selected (N−1) modules and the (N−1) input/output sections in the circuit block;
a signal input section that receives a signal designating which of the modules is to be disconnected from the (N−1) input/output sections;
a storage section that is capable of storing therein information about which of the modules is to be disconnected from the (N−1) input/output sections; and
a control section that generates, in a first operation mode, the control signal to disconnect the module designated by the signal provided to the signal input section from the (N−1) input/output sections, and in a second operation mode, generates the control signal to disconnect the module designated by the information written in the storage section from the (N−1) input/output sections;
subjecting the N modules to a deficiency test in the first operation mode; and
determining which of the modules is to be disconnected from the (N−1) input/output sections based on a test result in the test step, and writing information in the storage section to designate the module, wherein the test step includes:
a first step of generating the control signal to change a connection state among each of the modules at least in a group of the N modules and the (N−1) input/output sections;
a second step of detecting whether the circuit operates differently when the connection state is changed in the first step, and based on a detection result, determining whether or not at least the group of the modules includes a defective module, and
wherein the (N−1) input/output sections including a first input/output section to an (N−1)th input/output section, the N modules from a first module to an Nth module, and
the module selection section that selects, in accordance with the control signal, either an ith (where i is an integer from 1 to (N−1)) module or an (i+1)th module, and connects the selected module to an ith input/output section,
in the first step, the control signal is generated to make a change between a state in which the first module is disconnected from all of the input/output sections and a state in which the Nth module is disconnected from all of the input/output sections,
in the second step, when the circuit operates differently when the connection state is changed in the first step, a determination is made that the N modules includes the defective module, in a third step, from a pth (where p is an integer from 1 to (N−1)) module to a qth (where q is an integer from (p+1) to N) module determined in the second step as including the defective module, an rth module (where r is an integer from p to q) is selected, and the control signal is generated to disconnect the rth module from all of the input/output sections, and in the second step, a detection is made whether the circuit operates differently when a change is made between a state in which the pth module is disconnected from all of the input/output sections and a state in which the rth module is disconnected from all of the input/output sections, and/or whether the circuit operates differently when a change is made between a state in which the qth module is disconnected from all of the input/output sections and a state in which the rth module is disconnected from all of the input/output sections, and based on a detection result, a determination is made which of a group of the modules from the pth to the rth and a group of the modules from an (r+1)th to the qth includes the defective module, or which of a group of the modules of the pth to (r−1)th or a group of the modules from the rth to the qth.

3. The circuit device manufacturing method according to claim 2, further comprising a fourth step of detecting, when the group of the modules determined in the second step as including the defective module carries three of the modules, whether the circuit operates differently when the change is made between the state in which the qth module is disconnected from all of the input/output sections and the state in which the rth module is disconnected from all of the input/output sections, and whether the circuit operates differently when the change is made between the state in which the qth module is disconnected from all of the input/output sections and the state in which the rth module is disconnected from all of the input/output sections, and based on a detection result, identifying the defective module.

* * * * *